(12) United States Patent
Kim

(10) Patent No.: US 6,462,625 B2
(45) Date of Patent: Oct. 8, 2002

(54) MICROPOWER RC OSCILLATOR

(75) Inventor: Gyeong-Nam Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/859,785

(22) Filed: May 16, 2001

(65) Prior Publication Data

US 2002/0000889 A1 Jan. 3, 2002

(30) Foreign Application Priority Data

May 23, 2000 (KR) ............................................. 00-27841

(51) Int. Cl.[7] .............................. H03B 5/24; H03B 5/04
(52) U.S. Cl. ......................................... 331/57; 331/176
(58) Field of Search ........................ 331/57, 111, 143, 331/175, 176

(56) References Cited

U.S. PATENT DOCUMENTS

| | | | |
|---|---|---|---|
| 5,440,277 A | * 8/1995 | Ewen et al. | 331/176 |
| 5,570,067 A | 10/1996 | Shacter | 331/111 |
| 5,585,765 A | 12/1996 | O'Shaughnessy | 331/111 |
| 5,672,961 A | 9/1997 | Entrikin et al. | 323/315 |
| 5,828,329 A | 10/1998 | Burns | 341/155 |
| 6,198,356 B1 | * 3/2001 | Visocchi et al. | 331/34 |

* cited by examiner

*Primary Examiner*—David Mis
(74) *Attorney, Agent, or Firm*—Mills & Onello, LLP

(57) ABSTRACT

A micropower RC oscillator having stable frequency characteristics with varying temperature includes a number of inverting circuits which are driven by an external driving voltage and connected in series with each other and an RC circuit having a resistor disposed in between a head-inverter and a tail inverter to form a closed loop and a capacitor disposed between the tail-inverter and the head-inverter. The resistor comprises a plurality of unit resistors constituting of a P+ diffusion resistor and a polysilicon resistor having opposing characteristics with respect to temperature variation at a predetermined ratio. A resistance regulator controls the resistance of the resistor by decoding an external resistance setting data to select a unit resistor that determines the oscillation frequency effectively. A driving voltage circuit receives a reference signal having the voltage level which is stable against the temperature variation by using a current source and a load having opposing characteristics with respect to the temperature variation and provides as a driving voltage of the RC oscillating circuit after increasing a fan-out capacity of the reference signal. An output level shifting circuit can be added to the rear side of the RC oscillating circuit to adjust the voltage level of the oscillation signal with the appropriate standard required at a receiving end.

24 Claims, 17 Drawing Sheets

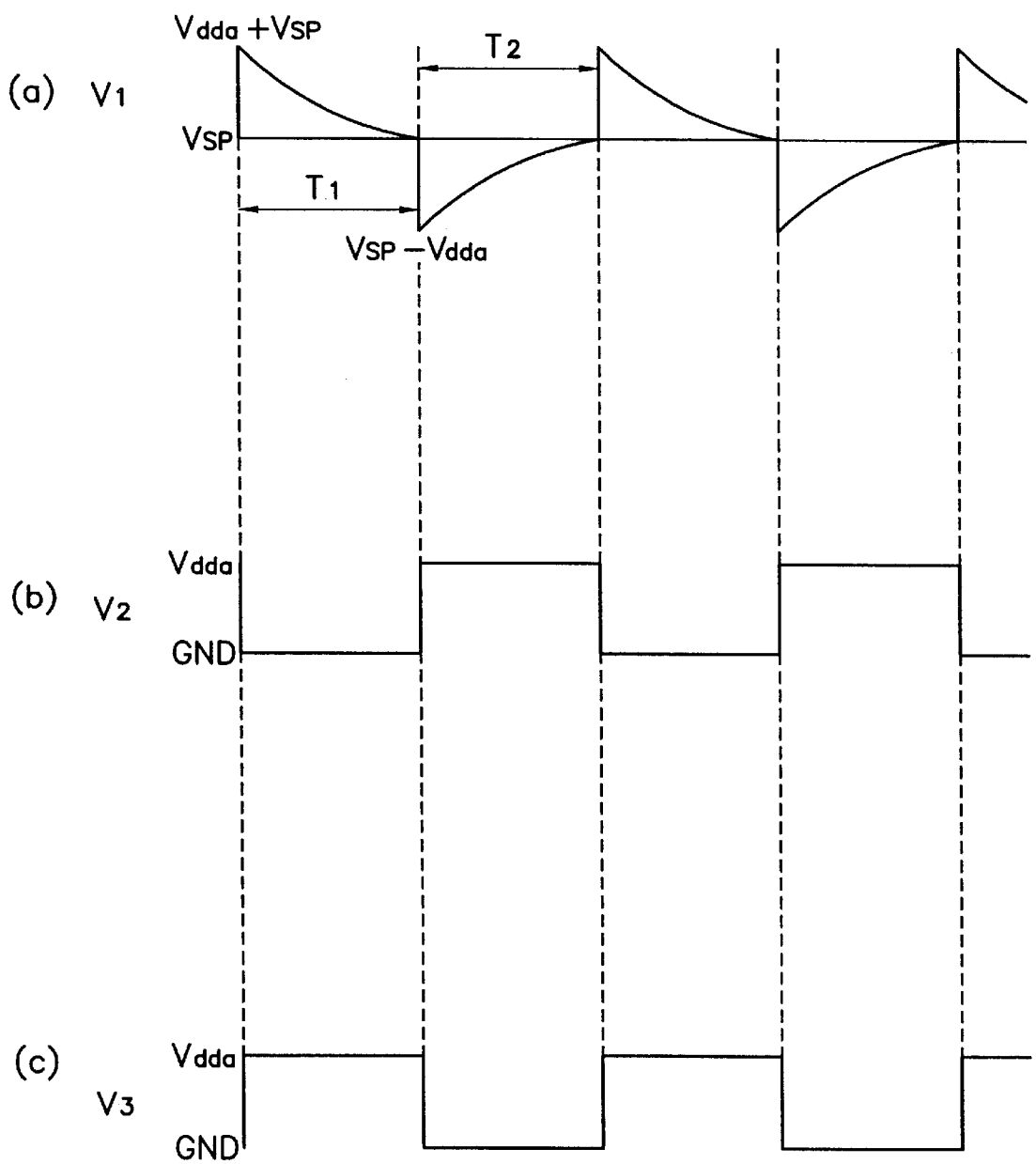

MICROPOWER RC OSCILLATOR

BACKGROUND OF THE INVENTION

1. Field of the Invention

The present invention relates to an oscillating circuit, and more particularly to a low power micropower RC oscillator that has stable oscillation frequency characteristics with varying temperature and capable of variably changing oscillation frequency by adjusting a resistance value.

2. Description of the Related Art

Oscillating circuits are commonly used as devices for providing a clock signal or a timing signal to electronic circuits such as a micro-processor, a micro-controller, a flip-flop circuit and a latch circuit. They are widely applied in industrial electronics. A crystal oscillating circuit provides an accurate and stable reference frequency.

However, in many applications, such a high-quality reference frequency is not required and since a mass productivity should be considered, an RC-type oscillator can be used as a low-cost clock signal source or a timing signal source. Also, an RC oscillator generates a variable frequency by changing the resistance R or capacitance C and avoids the use of inductors, which are difficult to fabricate on integrated circuits.

For various electronic circuit applications using a battery, such as mobile communication devices or portable electronic devices, very low current dissipation is required. Therefore, the micropower RC oscillator is suitable in those applications requiring low power dissipation since low power dissipation leads to longer battery life.

A micropower RC oscillator is disclosed in U.S. Pat. No. 5,570,067 (granted to Stuart B. Shacter) entitled "MICROPOWER RC OSCILLATOR HAVING HYSTERESIS PRODUCED BY SWITCHING CURRENT SOURCES TO A TRANSISTOR".

According to the above-mentioned U.S. patent, the RC oscillator employs a plurality of amplifiers and varies a threshold voltage thereof to obtain a hysteresis instead of using an RC circuit, a charge/discharge circuit, a general comparator and a general hysteresis circuit to change a reference voltage of the comparator. With this configuration, the oscillation frequency receives only a few effects by an internal delaying device, the RC oscillator can be operated using low current under the low power dissipation condition and the circuit configuration of the RC oscillator can be simplified as well.

However, certain operating characteristics, especially stable oscillation frequency characteristics with varying temperature, are desired as important performance parameters in the RC oscillator. The above-stated patent does not teach in detail on this point. One of the methods to obtain the stable temperature characteristics of the oscillation frequency is to employ a reference power having stable characteristics against the temperature variation. Examples of related art regarding this are disclosed in U.S. Pat. No. 5,828,329 (issued to Lawrence M. Burns) entitled "ADJUSTABLE TEMPERATURE COEFFICIENT CURRENT REFERENCE" and in U.S. Pat. No. 5,672,961 (issued to David W. Entrikin) entitled "TEMPERATURE STABLIZED CONSTANT FRACTION VOLTAGE CONTROLLED CURRENT SOURCE". These patents disclose a circuit configuration having the stable temperature characteristics, however, the focus is only pointed on an electric circuit and an example of RC oscillator is not disclosed.

Meanwhile, in the RC oscillator, it is a well-known fact that the oscillation frequency can be variably changed by controlling the value of an external resistor R. A majority of the micropower RC oscillator is composed of one chip. At this time, it is common to arrange the resistor R external to the chip for the oscillation frequency to have an individual relation with chip manufacturing process errors and to control the value of the resistor R. Accordingly, the manufacturing process of the RC oscillator becomes more complicated and the resulting RC oscillator is larger.

The RC oscillator basically includes a resistor R and a capacitance C and also requires a reference power for supplying a power source to the oscillating circuit and a circuit for controlling the voltage level of the oscillation signal. However, the above-mentioned patent references are related to the configuration of a portion of the RC oscillator. An example of a low-power type RC oscillator evaluated to be wholly considered having the advantages such as a low current dissipation, a stable oscillation frequency characteristics with varying temperature, a possibility of integrating in a single chip and an easy controllability of the oscillation frequency is given in U.S. Pat. No. 5,585,765 (issued to Timothy G. O'Shaughnessy) entitled "LOW POWER RC OSCILLATOR USING A LOW VOLTAGE BIAS CIRCUIT". The patent suggests an oscillator capable of self-calibrating that compares the oscillator-generated period with an RC time constant by employing an oscillator like a voltage controlled oscillator and controls the frequency of the RC oscillator according to the result compared. According to the patent, the RC oscillator is capable of generating an accurate oscillation frequency by self-calibrating and has a stable oscillation frequency by a self-temperature compensating ability. However, the RC oscillator requires a complicated circuit configuration to provide such functions.

SUMMARY OF THE INVENTION

Therefore, it is a first object of the present invention to provide a micropower RC oscillator having a low current dissipation, a variable resistor having complementary characteristics with varying temperature within the chip, and stable oscillation frequency characteristics against the temperature variation, while having a relatively simple circuit configuration.

It is a second object of the present invention to provide an RC oscillating circuit having stable frequency characteristics with respect to the temperature variation by means of variably selecting a plurality of unit resistors which are composed of resistor elements having opposing characteristics against the temperature variation to variably change the resistance value and capable of controlling the oscillation frequency.

To achieve the first object of the present invention, the micropower RC oscillator includes a driving voltage circuit which receives a reference signal having a stable voltage level in view of temperature variation by means of a current source and a load having an opposing temperature varying characteristics and increases a current fan-out capability of the reference signal to generate a driving voltage; and an RC oscillation circuit having an RC circuit including a plurality of inverting circuits connected in series with each other and respectively driven by the driving voltage, a resistor forming a closed loop disposed between an output terminal of a head-inverter connected to an output stage and an input terminal of a tail-inverter, a capacitor C disposed between the resistor and a connecting node of the input terminal of the tail-inverter and the input terminal of the head inverter.

At the output stage, an oscillation signal is oscillated in accordance with a frequency determined by the time constant of the RC circuit outputs.

The resistor R is a variable resistor having a resistance value that is variably set corresponding to external resistance data and the resistor is composed of resistor elements having characteristics opposite the temperature variation according to a predetermined ratio.

Preferably, the resistor further includes a resistance regulator for selecting a resistance value that contributes effectively to determine the oscillation frequency by means of decoding the resistance data.

In some cases, the voltage level of the oscillation frequency obtained from the RC oscillating circuit does not meet the voltage level required from a receiving end. To meet such a case, preferably, the micropower RC oscillator additionally includes an output level shifter for shifting the voltage level of the oscillation signal output from the RC oscillating circuit to a predetermined voltage level.

According to the aforementioned configuration, since the resistor of RC circuit and the driving voltage of RC oscillating circuit have stable characteristics against the temperature variation, variance of the frequency of the oscillation signal is negligible. Also, since the supply voltage required from the oscillating circuit is within the range of about 1.6V~3.6V in whole and the current dissipation is under than 6 uA, it has a preferable circuit configuration to design a low current and voltage type RC oscillator.

Meanwhile, to achieve the second object of the present invention, an RC oscillator of the present invention includes a plurality of inverters connected in series and independently driven by the driving voltage and an RC circuit having a variable resistor forming a closed loop disposed between an output terminal of a head-inverter connected to an output stage and an input terminal of a tail-inverter and variably changing a resistance value according to external resistance setting data, and a capacitor C disposed between the input terminal of the head-inverter and the input terminal of the tail-inverter. The frequency of the oscillation signal is determined by the time constant of the RC circuit.

Preferably, the variable resistor includes a number of unit resistors and a resistance regulator for selecting an effective resistance value that contributes to determine an oscillation frequency among the plurality of unit resistors based on the resistance setting data. Each of the unit resistors is preferably comprised of the combination of a P+ diffusion resistor and a poly-silicon resistor having opposing characteristics with the temperature variation. As a composition ratio of the both resistors is preferably to be a ratio that can compensate the difference of the frequency change between the two resistors against the temperature variation, so that the respective unit resistors have a stable characteristics against the temperature variation. The resistance regulator includes a decoder for decoding the resistance setting data and outputting the decoded resistance setting data to a number of output ports, a plurality of inverters, which are connected to the output ports of the decoder, for inverting the output value of the each of output ports and a number of bi-directional transmission gates respectively corresponding to the number of output ports. The resistance regulator includes a resistance selector in which the one end of the number of bi-directional transmission gates are commonly connected with each other and the other end thereof are connected to the one end of the number of unit resistors, and the first control terminal of the bi-directional transmission gates are respectively connected to the output ports of the decoder and the second control terminal thereof are connected to the output terminal of the inverter respectively connected to the output ports of the decoder.

According to the aforementioned configurations, the variance of the oscillation frequency against the temperature variation is relatively small because the characteristics of the resistor with varying temperature are stable. Also, since the resistor can be controlled externally, it is able to easily control the oscillation frequency. Furthermore, the variable resistor circuit can be installed in a single chip with other elements.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 5 shows a voltage wave chart of nodes of V1, V2 and V3 shown in FIG. 3;

DETAILED DESCRIPTION PREFERRED EMBODIMENTS

A description of the preferred embodiments will now be provided in detail with reference to the accompanying drawings.

Figure 1:
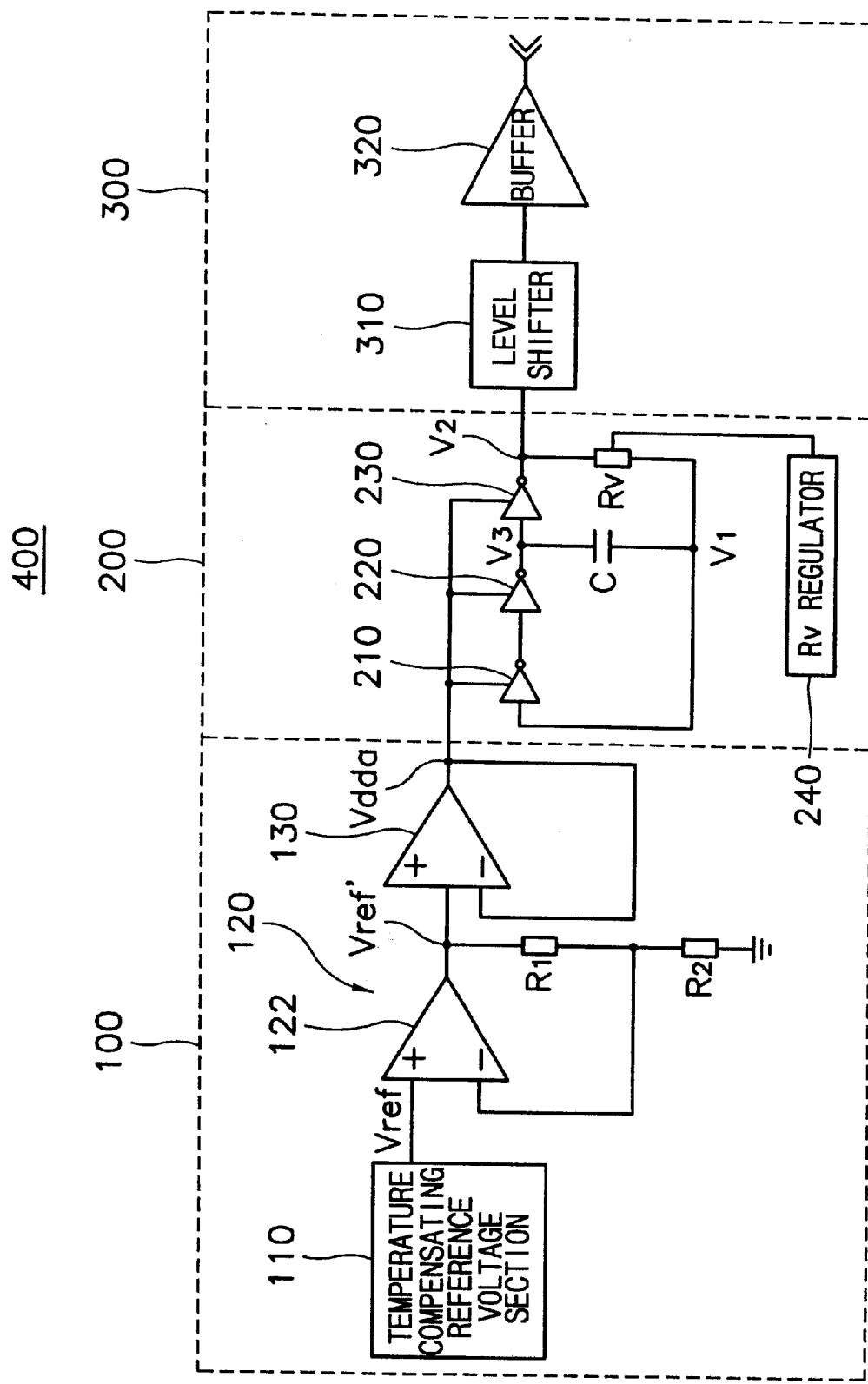
FIG. 1 shows a configuration of an RC oscillator according to a preferred embodiment of the present invention.

FIG. 1 depicts a circuit configuration of a micropower RC oscillator 400 according to a first preferred embodiment of the present invention. The micropower RC oscillator 400 includes a driving voltage circuit 100 and an RC oscillation circuit 200.

The RC oscillation circuit 200 controls a capacitor C to be repeatedly charged and discharged with a frequency decided by a time constant of an RC circuit. The RC circuit includes a plurality of inverter circuits connected in series and driven by the driving voltage supplied from the driving voltage circuit 100, a resistor and a capacitor to output a voltage waveform oscillated by the frequency into an output stage. Particularly, the RC oscillation circuit 200 includes a plurality of inverters, for example three inverters 210, 220 and 230. The three inverters 210, 220 and 230 are connected to the output stage of the driving voltage circuit 100. Also, the RC oscillation circuit 200 has a variable resistor Rv and a capacitor C. The variable resistor Rv forms a closed loop disposed between an output terminal of a head-inverter 230 connected to the output stage and an input terminal of a tail-inverter 210. The capacitor C is disposed between a connecting node of the input terminal of the tail-inverter 210 and the variable resistor Rv, and an input terminal of the head-inverter 230. The RC oscillation circuit 200 has a resistance regulator 240 for variably selecting the resistance value of the variable resistor Rv.

The driving voltage circuit 100 supplies a driving voltage Vdda to the inverters 210, 220 and 230 of the RC oscillation circuit 200 and includes a temperature compensating reference voltage section 110 and a buffer amplifier 130. Furthermore, the driving voltage circuit 100 includes a voltage amplifier 120, which is disposed between the temperature compensating reference voltage section 110 and the buffer amplifier 130, for providing a reference signal V'ref newly obtained by increasing the voltage level of the reference signal Vref generated by the temperature compensating reference voltage section 110 to a predetermined voltage level to the buffer amplifier 130.

In FIG. 1, a case including the three structural elements is illustrated. According to this illustration, the voltage amplifier 120 includes an operational amplifier 122 and resistors R1 and R2 for voltage division connected between an output terminal of the operational amplifier 122 and a ground reference voltage in series. A non-inverting terminal of the operational amplifier 122 is connected to the output terminal of the temperature compensating reference voltage section 100 and an inverting terminal thereof is connected to the connecting node of the resistor R1 and resistor R2.

The buffer amplifier 130 may comprise an operational amplifier. The non-inverting terminal of the operational amplifier 130 is connected to the output terminal of the voltage amplifier 120 and the inverting terminal is connected commonly to the output terminal thereof, and the output terminal is connected to each of the three inverters 210, 220 and 230 of the RC oscillation circuit 200.

The micropower RC oscillator 400 further includes an output level shifting circuit 300 for shifting the voltage level of the oscillation signal output from the RC oscillation circuit 200 to a predetermined voltage level. The output level shifting circuit 300 has a level shifter 310 connected to the output terminal for shifting up and outputting the oscillation signal provided from the RC oscillation circuit 200 and an output buffer 320 connected to the output terminal of the level shifter 310 for processing an amplitude of the oscillation signal at the output terminal to be coincident with the voltage level of a supply voltage Vdd by means of the input of the shifted up oscillation signal. The oscillation signal is transmitted to the external application object through the output buffer 320.

Figure 2:
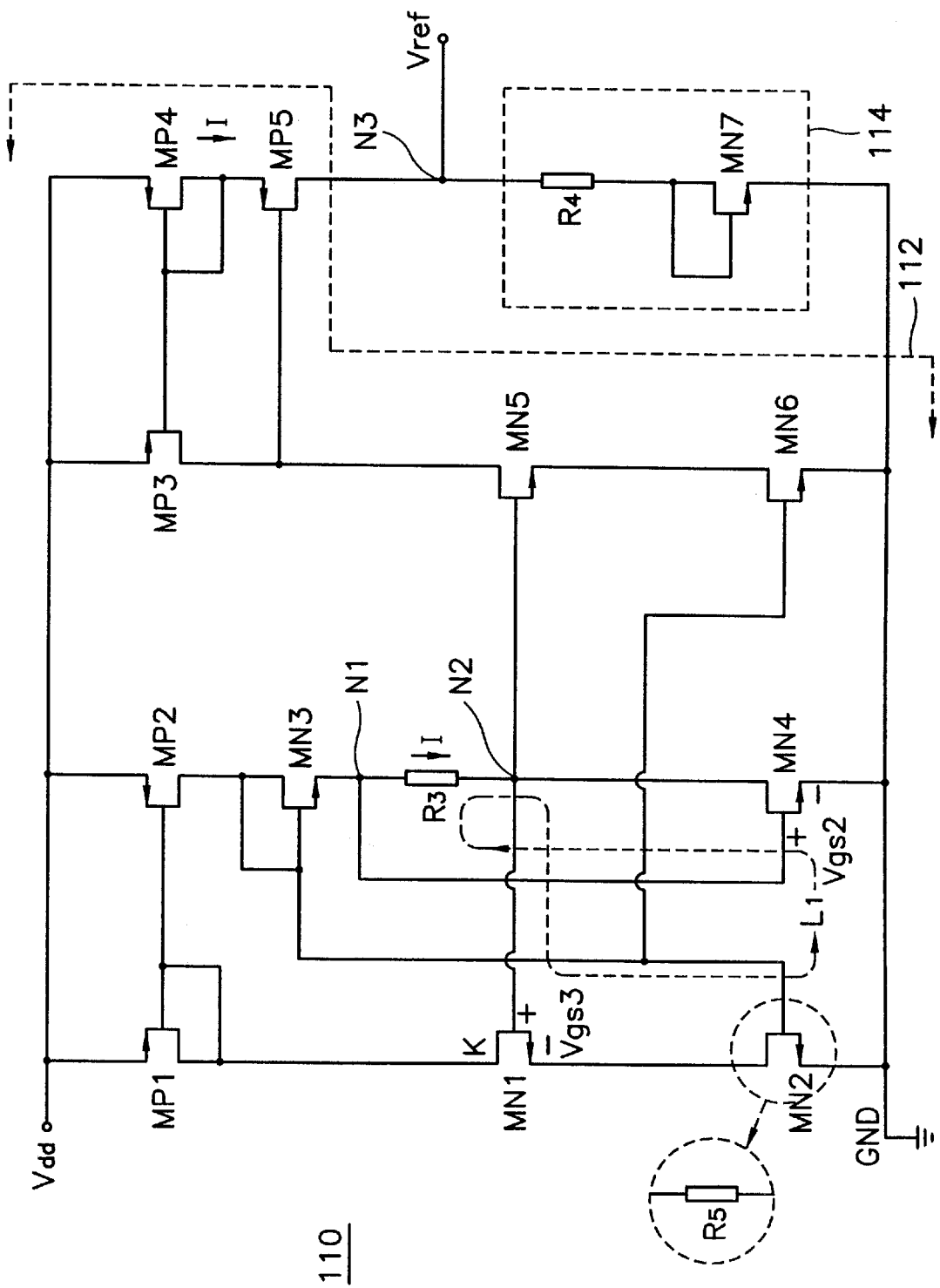
FIG. 2 shows a circuit configuration according to a first embodiment of a temperature compensating reference voltage section shown in FIG. 1.

FIG. 2 shows a circuit configuration of the temperature compensating reference voltage section 110 of the driving voltage circuit 100 according to the first preferred embodiment of the present invention. In FIG. 2, the driving voltage circuit 100 has an output stage 114 having a resistor R4 connected between the output terminal N3 and a ground voltage GND in series and an MOS transistor MN7 and a PTAT (proportional to absolute temperature) current source 112, which is connected to the output terminal N3, for supplying a current having proportional characteristics with varying temperature to a branch of the output terminal. The MOS transistor MN7 is operated as a diode by shorting the source and gate thereof.

As shown in FIG. 2, the PTAT current source 112 has a first branch in which a first MOS transistor MN1 and a first resistor R5 are connected in series thereto, a second branch in which a second resistor R3 and a second MOS transistor MN4 are connected in series thereto and a current mirror MP1, MP2 and MN3 for supplying a branch current to the first and the second branches. Preferably, an MOS transistor MN2 is employed as the first resistor R5. Particularly, the both ends of the second resistor R3 are respectively connected to the first and second MOS transistors MN1 and MN2 to form a closed loop so that the branch current I is represented by $$I=(Vgs4-Vgs2)/(R5+R3)=nV_T \ln K.$$

wherein, n is a ideality factor, Vgs2 and Vgs3 respectively indicate a gate-source voltage of the first and the second MOS transistors in a weak inversion region, $V_T$ is a threshold voltage of the first and second MOS transistors MN1 and MN2, and K indicates the size ratio of the channel width of the source-drain of the first MOS transistor MN1 in response to the channel width of the source-drain of the second MOS transistor MN2. The PTAT current source 112 has a current mirroring circuit composed of a plurality of MOS transistors MP3, MP4, MP5, MN5 and MN6. The current mirroring circuit mirrors the branch current I of the second branch to supply the branch current I to the output stage 114.

Figure 3:
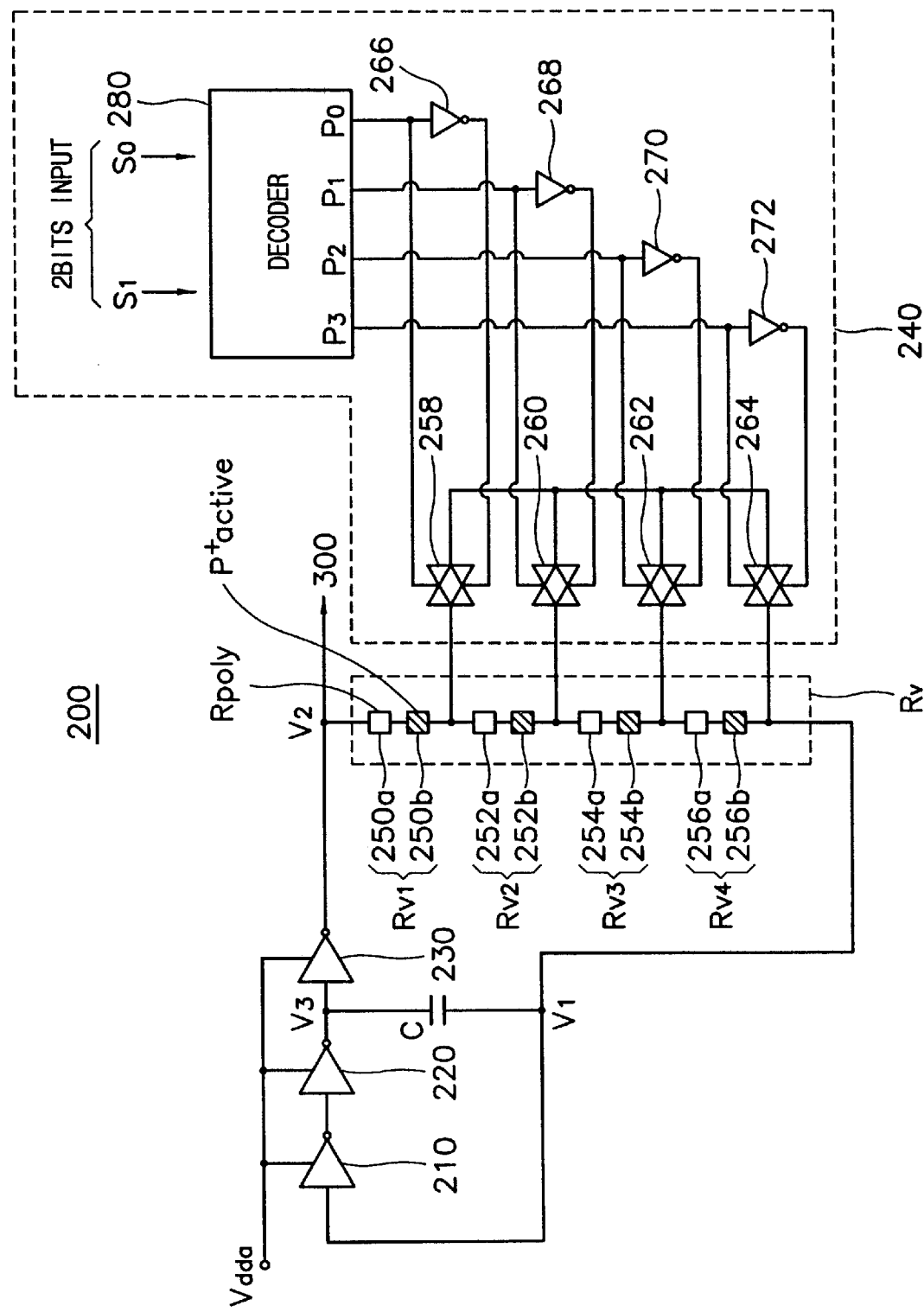
FIG. 3 shows a circuit configuration of an RC oscillating circuit including a preferable circuit configuration of a variable resistor circuit shown in FIG. 1.

FIG. 3 illustrates a configuration of the RC oscillating circuit 200 of FIG. 1 including a preferable circuit configuration of a variable resistor circuit 240. The variable resistor circuit 240 is composed of a variable resistor Rv and a resistance regulator 240.

The variable resistor Rv includes a plurality of unit variable resistors Rv1, Rv2, Rv3 and Rv4. Each of the unit variable resistors has self-temperature compensating characteristics by combining a P$^+$ diffusion resistor and a polysilicon resistor having opposing characteristics against the temperature variation in series. In FIG. 3, the P$^+$ diffusion layer is represented by reference numerals 250b, 252b, 254b and 256b and the Rpoly area is represented by reference numerals 250a, 252a, 254a and 256a.

The resistance regulator circuit 240 selects an effective resistor that contributes to decide an oscillation frequency among the plurality of unit resistors based on externally provided resistance setting data. In order to have such functions, the resistance regulator 240 has a decoder 280 for decoding the resistance setting data and outputs the resistance setting data to the plurality of output ports thereof, a plurality of inverters 266, 268, 270 and 272, which are connected to each of the output ports of the decoder 280, for respectively inverting an output value of each of the output ports of the decoder 280 and a plurality of bi-directional transmission gates 258, 260, 262 and 264 corresponding to each of the unit variable resistors Rv1, Rv2, Rv3 and Rv4. First ends of each bi-directional transmission gate 258, 260, 262 and 264 are connected with each other and the other ends of each gate 258, 260, 262 and 264 are each independently connected to one end of the plurality of unit variable resistor pairs 250a and 250b, 252a and 252b, 254a and 254b, and 256a and 256b. Each of the first control terminals of the bi-directional transmission gates 258, 260, 262 and 264 are respectively connected to the corresponding output port of the decoder 280 and each of the second control terminals thereof are respectively connected to the output port of the inverters 266, 268, 270 and 272 connected to the corresponding output port of the decoder 280. Accordingly, the bi-directional transmission gates 258, 260, 262 and 264 are operated as a resistance selector for deciding the effective resistance of the variable resistor Rv that contributes effectively to decide the value of the oscillation frequency of the output voltage V2 obtained from the output stage of the RC oscillation circuit 200.

Figure 4:
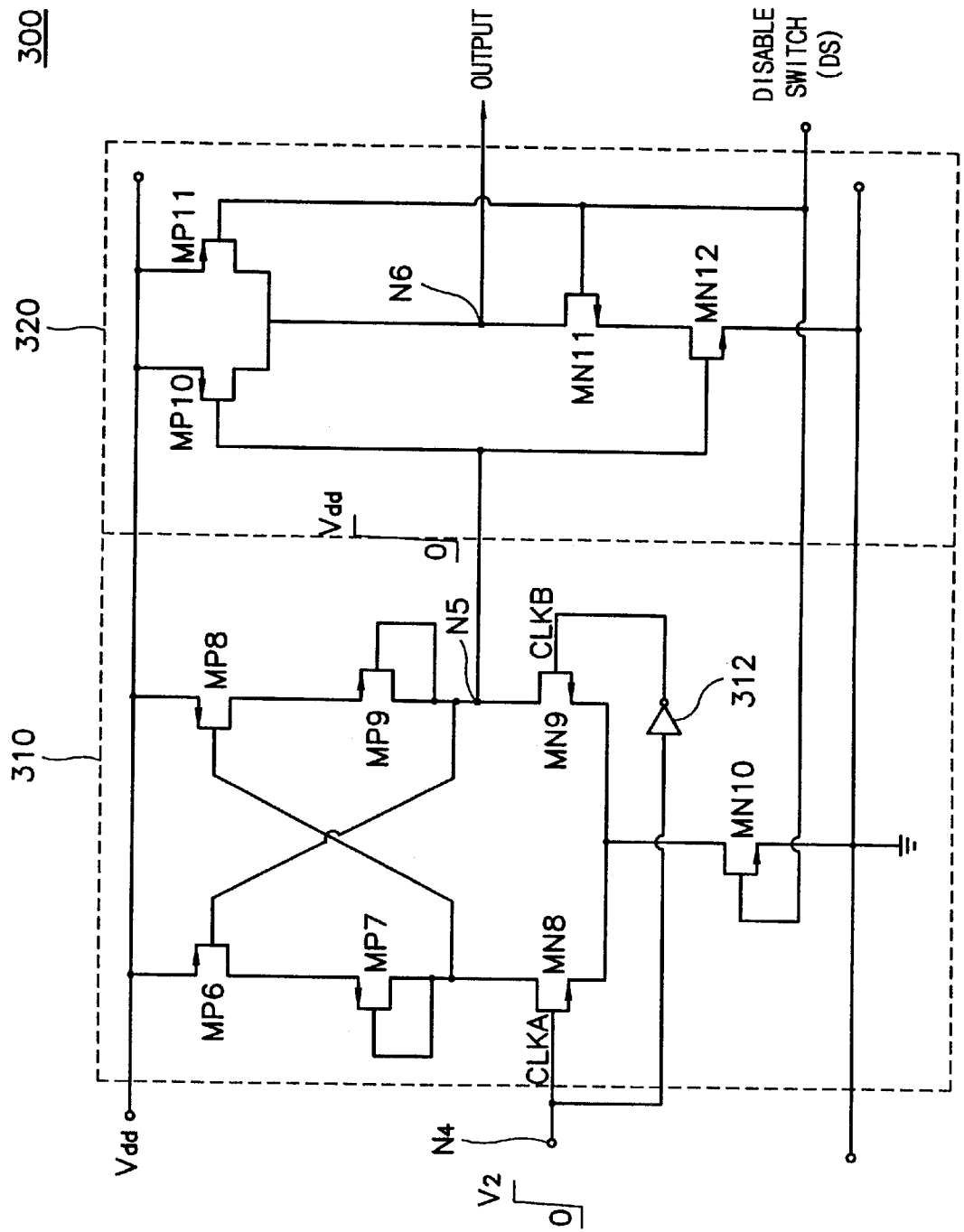
FIG. 4 shows a preferable circuit configuration of an output level shifting circuit shown in FIG. 1.

FIG. 4 shows a configuration of the output level shifting circuit 300 of FIG. 1. The output level shifting circuit 300 includes a level shifter 310 for shifting a low voltage pulse V2 to a high voltage pulse Vdd. In a case where an amplitude which is different from the amplitude of the oscillation signal output from the level shifter 310 is used, the level shifter 310 has the output buffer 320 for buffering the amplitude of the oscillation signal.

The level shifter 310 shown in FIG. 4 is in a cross-coupled configuration. The level shifter 310 includes an MOS transistor MN10 in which a gate is connected to the disable switch DS and one end is connected to the ground voltage, a plurality of MOS transistors MP6, MP7 and MN8 connected between supply voltage Vdd and the first branch of the MOS transistor MN 10 in series, another plurality of MOS transistors MP8, MP9 and MN9 connected between the supply voltage Vdd and the second branch of the MOS transistor MN10 in series, and a inverter 312, which is disposed between an input stage N4 and a base terminal of the MOS transistor MN9, for inverting a logic value of CLKA. The MOS transistors MP7 and MP9 are operated as a diode by shorting a drain and a gate thereof, and each gate of the MOS transistors MP6 and MP8 are respectively cross connected to the MOS transistors MN9 and MN8.

The output buffer 320 includes MOS transistors MN11 and MN12 connected between an output stage N6 and the ground terminal in series and MOS transistors MP10 and MP11 connected between the output terminal N6 and the supply voltage Vdd in parallel. The gates of the MOS transistors MP10 and MP12 are connected to the output terminal N5 of the level shifter 310 and the gates of the MOS transistors MN11 and MP11 are connected to the disable switch DS (not shown) which controls the operating state of the micropower RC oscillator 400.

Hereinafter, the operating characteristics of the micropower RC oscillator 400 will be described in detail.

The characteristics of the temperature compensating reference voltage section 110 shown in FIG. 2 is a reference voltage circuit having self-temperature compensating characteristics by utilizing reciprocal characteristics of the MOS transistor against an absolute temperature in the weak inversion region. The temperature compensating characteristics will be described as followed in detail. The voltage equation of the closed loop L1 is represented by the following equation 1.

$$Vgs2-Vgs3=IR3+IR5 \qquad \text{[Equation 1]}$$

Accordingly, the branch current I is represented as follows.

$$I=(Vgs2-Vgs3)/(R3+R5) \qquad \text{[Equation 2]}$$

Meanwhile, a sub-threshold drain current Id in the weak inversion region is indicated as following equation 3.

$$Id=Ido(W/L)(e^{vgs}/nV_T) \qquad \text{[Equation 3]}$$

Utilizing equation 3, Vgs is represented as follows.

$$Vgs=nV_T ln(IL/IdoW) \qquad \text{[Equation 4]}$$

Therefore, Vgs2 and Vgs3 can be described as follows, noting that L is a channel length in the direction that current flows between the source and drain; W is a channel width perpendicular to L.

$$Vgs2=nV_T ln(IL/IdoW) \qquad \text{[Equation 5]}$$

$$Vgs3=nV_T ln(IL/IdoKW) \qquad \text{[Equation 6]}$$

The difference of Vgs2 and Vgs3 is therefore as follows.

$$Vgs2-Vgs3=nV_T ln(IL/IdoW)-Vgs=nV_T ln(IL/IdoKW)$$
$$=nV_T lnK \qquad \text{[Equation 7]}$$

So, the reference voltage Vref indicated in the output terminal N3 is as follows.

$$Vref=IR4+Vgs7 \qquad \text{[Equation 8]}$$

When substituting equation 7 to equation 2 to obtain the branch current and substituting the result to equation 8, finally the reference voltage Vref is obtained as follows.

$$Vref=R4(nV_T lnK)/(R3+R5)+Vgs7 \qquad \text{[Equation 9]}$$

Here, the temperature coefficient of 'Vgs2–Vgs3' has proportional (PTAT) characteristics against the absolute temperature and considering Equation 2, the branch current I also has the same characteristics, so the first term of the right part of the Equation 9 changes its value proportionally according to the absolute temperature. On the contrary, the temperature coefficient of the threshold voltage in the weak inversion region of the MOS transistor MN7 has inverse proportional (CTAT) characteristics, so that the second term of the right part of the Equation 9 changes proportionally inversely with varying absolute temperature. In other words, since the variance of the two terms on the right part of the Equation 9 are compensationally related with each other, the reference voltage Vref output from the temperature compensating reference voltage section 110 can maintain a stable voltage level regardless of the temperature variation. The level of the reference voltage is lower than the level of supply voltage Vdd, so the current dissipation in an RC oscillation circuit 200 can be largely decreased. Furthermore, by regulating the K value, the slope of the first term on the right part of the Equation 9 also can be regulated; such regulation will be advantageous in the circuit design.

The reference voltage Vref is provided as a reference voltage of the non-inverting terminal (+) of the voltage amplifier 122 and the level is amplified according to the following Equation 10.

$$V'ref=(1+R1/R2)Vref \qquad \text{[Equation 10]}$$

The amplified reference voltage V'ref is provided to the non-inverting terminal of the buffer amplifier 130. The buffer amplifier 130 increases the fan-out capacity of the reference signal by means of buffering enough current to drive the load, such as the RC oscillation circuit 200, in order to generate the driving voltage Vdda and provides the driving voltage Vdda to the inverters 210, 220 and 230 of the RC oscillation circuit 200, respectively.

The operation of the RC oscillation circuit 200 will now be described with reference to FIGS. 3 to 5. Assuming the first electrode voltage V3 of the capacitor C connected to the input terminal of the head-inverter 230 to be "high" (Vdda), the voltage V1 of the second electrode is pumped as a Vdda+Vsp and the output terminal voltage V2 is kept at a "low" (GND) level. Here, Vsp is an initial voltage of the capacitor C. When the voltage V1 discharges and drops to the logic threshold voltage, the voltage V3 reverses to "low" and the voltage V1 also drops to Vsp−Vdda while the voltage V2 of the output terminal reverses again to "high" (Vdda). When the capacitor C is recharged by the voltage V2 of the output terminal and the voltage V1 approaches the logic threshold voltage, V3 reverses to "high" and the voltage V2 of the output terminal reverses to "low" (GND). By repeatedly charging/discharging the capacitor C in the above-described manner, a rectangular pulse as shown in FIG. 5(b) is generated at the output terminal.

In FIG. 5 (a), a discharging time period T1 and a charging time period T2 are described as follows.

$$-Vsp+(Vdda-Vsp)(1-e^{-T1/RC})=Vsp$$

$$T1=RvC\ In\{(Vdda+Vsp)Vsp\} \qquad \text{[Equation 11]}$$

$$(Vdda+Vsp)e^{-T2/RC}=Vsp$$

$$T2=RvC\ In\{(Vdda+Vsp)Vsp\} \qquad \text{[Equation 12]}$$

Since an oscillation cycle T of the voltage waveform V2 of the output terminal is 'T1+T2', the oscillation frequency f_osc of the voltage waveform V2 is as follows.

$$f\_osc=1/(T1+T2)=\tfrac{1}{2}RvC\ In\{(Vdda+Vsp)/Vsp\} \qquad \text{[Equation 13]}$$

When assuming Vsp=Vdda/2, the oscillation frequency f_osc is as follows.

$$f\_osc=\tfrac{1}{2}.2RvC \qquad \text{[Equation 14]}$$

As can be seen from the above equation 14, since the changes of the oscillation frequency f_osc depends on the size of the resistance value Rv and capacitance C, the offset between the process tolerance of the resistor Rv and capacitor C and the lots becomes an important characteristic of the oscillation frequency f_osc.

Meanwhile, the temperature characteristics of the resistor Rv and the capacitor C is to be stabilized in order to prevent the oscillation frequency f_osc from sensitively changing with temperature variation. However, the resistor Rv generally has sensitive characteristics against the temperature variation. The equation that indicates the temperature dependency of the resistor is as follows.

$$R(dT)=R_{25}(1.0+TC1^*dT+TC2^*dT^2) \qquad \text{[Equation 15]}$$

The $R_{25}$ indicates a square resistance at 25 degrees centigrade, TC1 and TC2 indicates respectively temperature coefficient, and dT indicates the difference between the 25 degrees centigrade and temperature, respectively. In Equation 15, the accurate resistance value can be obtained with regardless of the high-order $dT^2$ value in the above parenthesis.

Table 1 is showing the temperature coefficient by each resistor in the 0.6μCMOS process.

TABLE 1

| Resistor item | TC1(ppm/° C.) | TC2(ppm/° C.) | $R_{25}$(Ω/ ) |
|---|---|---|---|
| $P^+$ diffusion resistor | 957 | 3.31 | 120.74 |
| Polysilicon resistor | −4110 | 9.21 | 3519 |

As can be seen from the Table 1, the $P^+$ diffusion resistor ($P^+$ active) and polysilicon resistor (Rpoly) have opposing characteristics against the temperature variation.

Figure 6A:
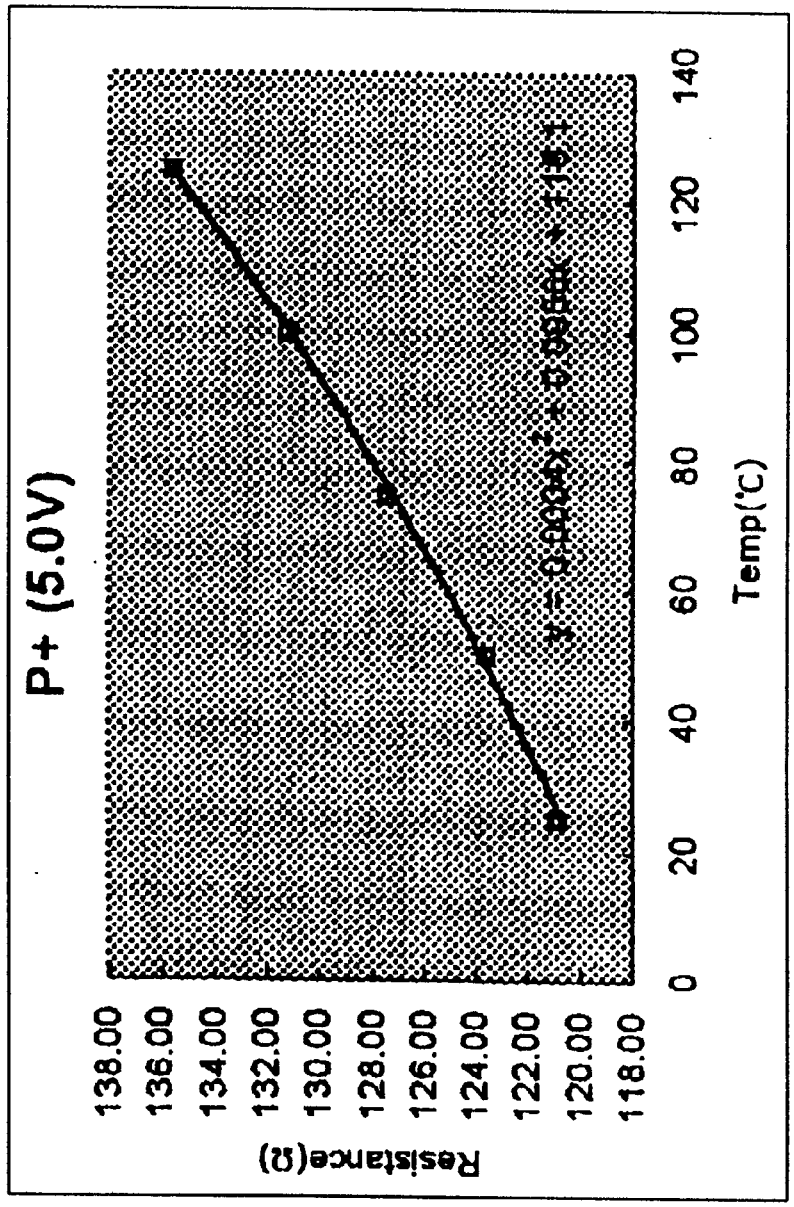
FIGS. 6A and 6B show resistance characteristics according to the temperature variation of a P+ diffusion resistor and a poly-silicon resistor.
Figure 6B:
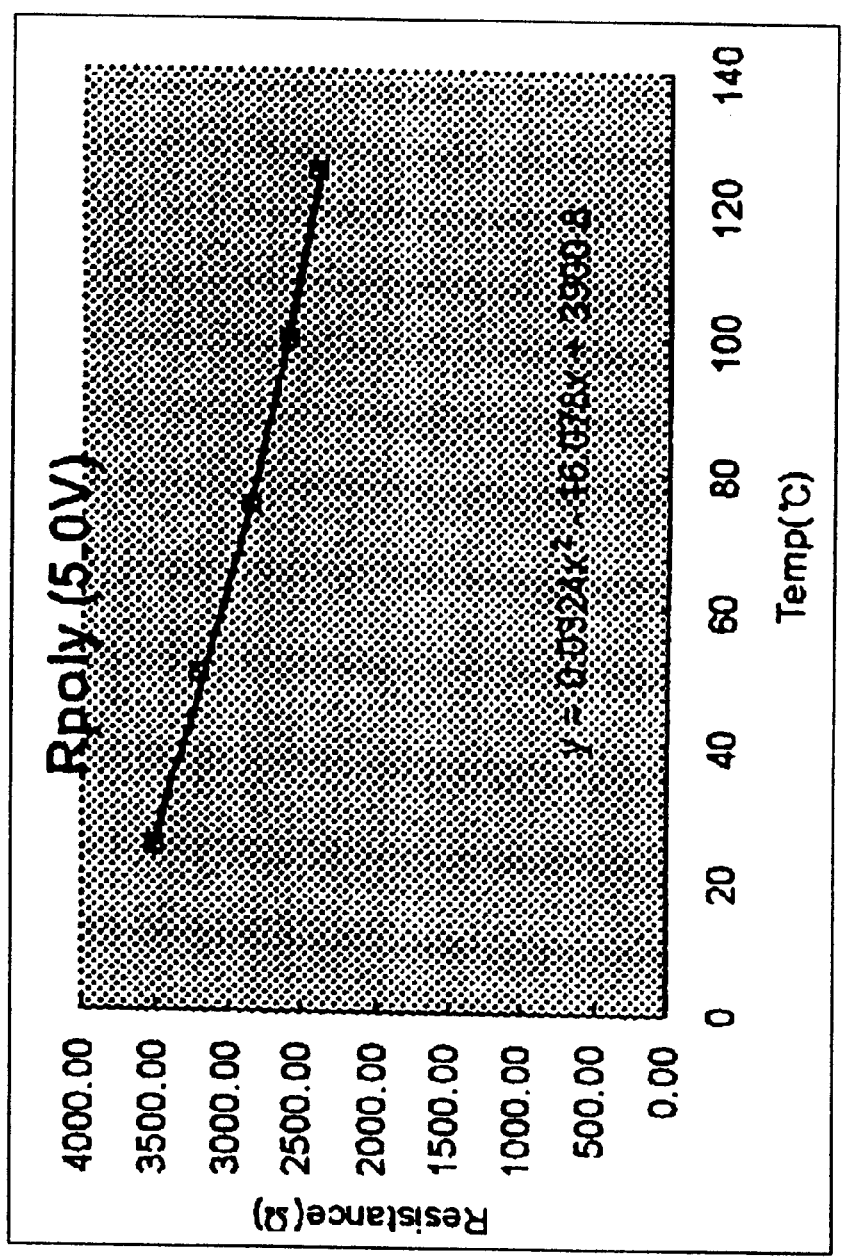

FIGS. 6A and 6B show the resistance characteristics of the $P^+$ diffusion resistor and Polysilicon resistor against the temperature variation. The resistance value of the $P^+$ diffusion resistor has a proportional relation with the temperature variation while the resistance value of the Polysilicon resistor Rpoly has an inverse proportional relation against the temperature variation. The fact that a stable resistance value against the temperature characteristics can be obtained by compensating effect when combining two different resistor items having the opposing characteristics for composing a unit resistor should be noted. The variable resistor Rv in FIG. 3 illustrates a configuration of the plurality of unit variable resistors Rv1, Rv2, Rv3 and Rv4 connected in series. Combining the above two resistor items in series composes one of the unit variable resistors.

When comparing the two graphs shown in FIGS. 6A and 6B, an absolute value of the slopes are different. This indicates that the stable resistance value against the temperature variation cannot be obtained by constituting two resistor items with a same proportion in composing the unit variable resistor. To achieve a stable resistance value against the temperature variation for the unit variable resistor, the two resistor items should be included with an appropriate ratio in considering the temperature coefficient TC1 and TC2 of the $P^+$ diffusion resistor and polysilicon resistor. The unit variable resistor has a self-temperature compensating characteristics with this configuration. To calculate the optimum combination ratio is relatively straightforward for one skilled in the art, so the detail will not be described herein.

Meanwhile, according to the characteristics of a receiving end of the oscillation signal, the value of the oscillation frequency f_osc must be made to be different. To meet this requirement, the capacitance of the capacitor and/or the resistance value of the resistor of the RC oscillator 200 should be varied. As shown in FIG. 3, the present invention provides an RC oscillating circuit with a variable resistor Rv capable of variably setting the resistance value and the resistance regulator 240 for regulating the resistance value of the variable resistor.

The resistance value of the variable resistor Rv is decided by the on or off state of the bi-directional transmission gates 258, 260, 262 and 264 corresponding to each of the unit variable resistors. Since the bi-directional transmission gates 258, 260, 262 and 264 are devices having transfer characteristics capable of equally transferring in both directions and the capacitor C repeats the charging and discharging operations, a bi-directional transmission gate is preferred. Each of the on/off states of the bi-directional transmission gates 258, 260, 262 and 264 is decided by the logic level of the corresponding output port of decoder 280 and the logic level of an output value of an inverter connected to the corresponding output port of the decoder 280. As shown in FIG. 3, in a case where the plurality of the unit variable resistors and the bi-directional transmission gates are four units, respectively, the input data of the decoder 280 are composed of two bits. The two bits input data are provided from an external device. The external device may comprise, for example, a regulator that selects the oscillation frequency by means of variably adjusting the resistance value of the variable resistor Rv.

According to the aforementioned configuration of the variable resistor, the variable resistor Rv and the resistance regulator 240 can be installed within a single chip when the micropower RC oscillator 400 is packaged as a single chip.

Table 2 shows the logic states of output port p0, p1, p2 and p3 of the decoder 280 with respect to the two bits input data s0 and s1 of the decoder 280 and the resistance value of the vanable resistor Rv corresponding to the respective logic states.

TABLE 2

| (s0, s1) | (p0, p1, p2, p3) | Rv |
|---|---|---|
| (0, 0) | (0, 0, 0, 0) | Rv1 + Rv2 + Rv3 + Rv4 |
| (0, 1) | (1, 1, 1, 1) | Rv1 + Rv2 + Rv3 |
| (1, 0) | (0, 1, 0, 1) | Rv1 + Rv2 |
| (1, 1) | (1, 0, 0, 1) | Rv1 |

As can be seen from Table 2, the size of the variable resistor Rv varies according to the input value of the decoder 280, ultimately, the oscillation frequency of the output voltage V2 can be varied by means of the input value of the decoder 280.

Next, the operation of the output level shifting circuit 300 will be described with reference to FIG. 4. The level shifter 310 receives the oscillation signal V2 represented at the output terminal of the RC oscillation circuit 200 having a swing range of about 0~V2 through the input terminal N4 and outputs an oscillation signal having a wider swing range than the amplitude of the input signal through the output terminal N5. The oscillation signal having a wider swing range obtained from the level shifter 310 is output after shifting as a oscillation signal having a swing range of the supply voltage Vdd through the output buffer 32 operated as an inverter circuit.

The disable switch Ds is operated as a switching means for controlling the micropower RC oscillator 400 in whole and the 'high' signal is always input while the micropower RC oscillator 400 operates. This, in turn, causes the MOS transistors MN10 and MN11 to be turned on and MP11 to be turned off.

In the gate of MOS transistors MN8 and MN9 of the level shifter 310, an oscillation signal CLKA(=V2) of the RC oscillation circuit 200 and a reversing signal CLKB thereof are input, respectively. In a case where the signal 'DS' of the disable switch DS (not shown) supplied from outside is "high" and the oscillation signal CLKA is "high", the MOS transistors MN8 and MN9 are turned "on" and "off", respectively. As a result, since the MOS transistors MP8 and MP6 are respectively turned "on" and "off", the voltage approached the supply voltage Vdd, critically Vdd-Vgs is presented at the output node N5. On the contrary, when the oscillation signal CLKA is "low", the MOS transistors MN8 and MN9 are respectively turned "off" and "on" and a ground voltage is presented at the output node N5.

While the voltage of the output node N5 is maintained as Vdd-Vgs, the MOS transistor MP10 turns off and the MOS transistor MN12 turns on, so that the ground voltage is presented in the output node N6. On the contrary, when the ground voltage is applied at the output node N5, the MOS transistor MP10 turns on and MOS transistor MP12 turns off, so that the supply voltage Vdd of a full-level is presented at the output node N6.

The aforementioned RC oscillating circuit is designed in consideration of low power dissipation. The current dissipation Pavg in the RC oscillation circuit 200 can be expressed by multiplying the voltage Vdda and the current Iavg supplied to the RC oscillation circuit 200 as follows.

$$Pavg = Vdda*Iavg = Vdda*(Q/T)$$
$$= Vdda*(CVdda)/T = C(Vdda)^2/T$$
$$= C(Vdda)^2 f - osc$$

[Equation 16]

In the above equation 16, the current dissipation in the RC oscillation circuit 200 depends on the voltage level of the driving voltage Vdda. However, if the buffer amplifier 130 of the driving voltage circuit 100 is composed of a voltage follower, the current driving capacity can be increased without increasing the voltage level of the driving voltage required from the RC oscillation circuit 200. Therefore, the RC oscillator can be configured to have low power dissipation.

Furthermore, the output level shifting circuit 300 shown in FIG. 4 is a low power dissipation type. Since the voltage that the level shifter 310 generates to boost the voltage level of the oscillation signal to a voltage level required from the receiving end of the oscillation signal is a low-level voltage which is sufficient to turn on/off the gates of the MOS transistors MP10 and MN12, the current dissipation of the level shifter 310 is very low.

In an experimental embodiment, a 20 Khz~40 Khz low voltage (1.8V~3.6V) and low power oscillating circuit was assembled and characteristics thereof were measured in order to apply the concept of the micropower RC oscillator 400 described above to a low voltage LDI (LCD driver IC). The circuit size was 0.076 mm×0.032 mm and the fabricating method was 0.65 um n-well CMOS process. The primary characteristics that were measured were frequency with respect to the supply voltage Vdd, a current, a frequency with respect to a reference voltage and change characteristics of duty and temperature, and the change of the current and reference voltage. In the experimental embodiment, the normal supply voltage of the circuit was 2.4V and the total current consumption Idd of the circuit flowing to the ground terminal was about 6.3 uA.

FIGS. 7A to 7D respectively show a frequency of the oscillation signal obtained from the experimental micropower RC oscillator 400, the total current consumption Idd, the duty ratio of the oscillation signal and the change characteristics of the reference voltage obtained from the temperature compensating reference voltage 110 when the supply voltage Vdd of the micropower RC oscillator 400 is varied within the range of 1.8~3.6V. As can be seen from the graphs, the oscillation frequency of the oscillation signal and the consumption current Idd shows a difference about 200 Hz (34.15~34.35 Khz) and 270 nA (6.28~6.55 uA) according to the measurement. That is, the oscillation frequency and the consumption current demonstrate negligible variance against the change of the supply voltage Vdd; it can be determined as stable. Also, the duty ratio of the output oscillation signal and the changed range of the reference voltage Vref against the supply voltage Vdd are about 0.35% and 0.015V, respectively.

Figure 7A:
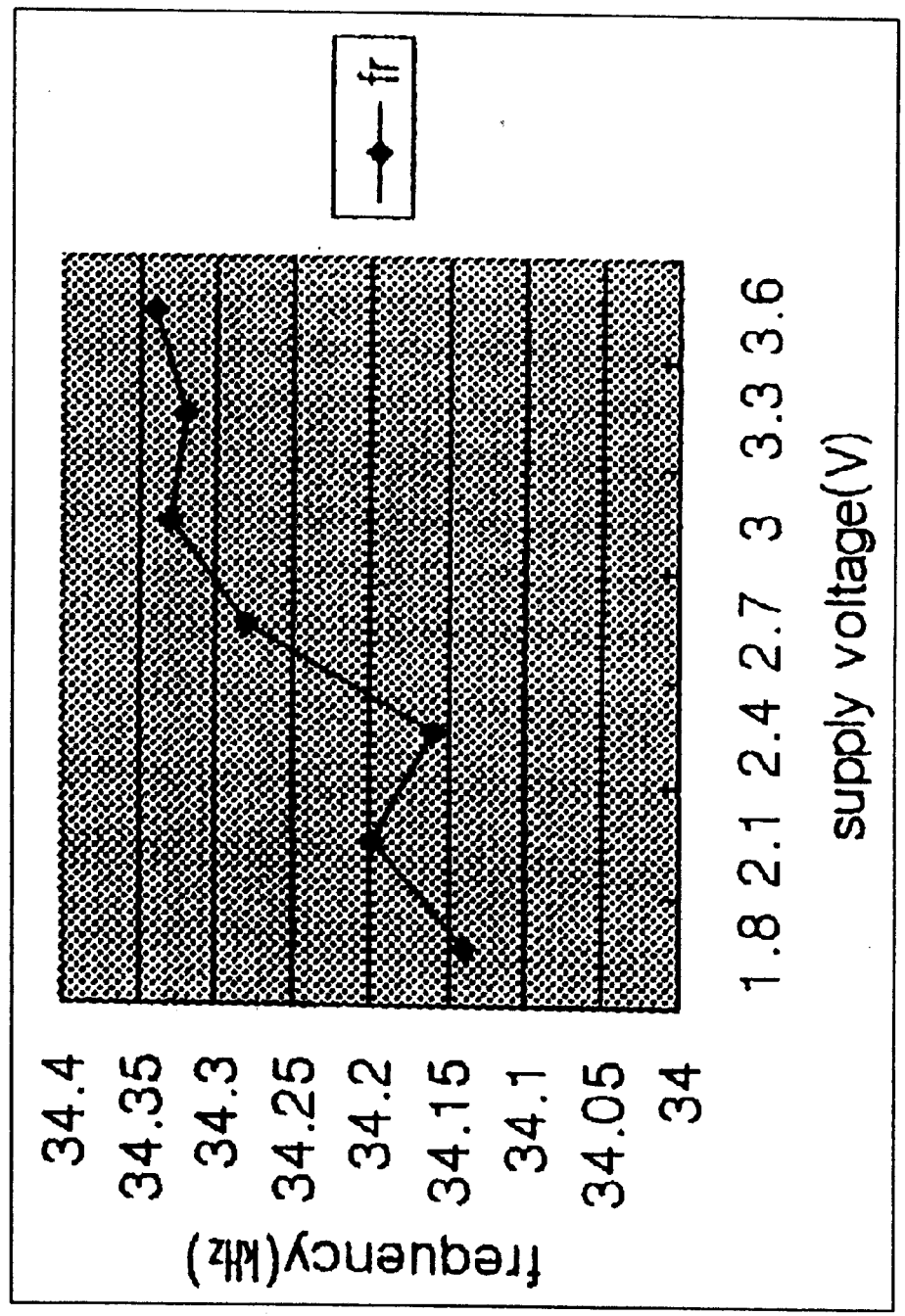
FIGS. 7A to 7D show an oscillation frequency of an oscillation signal obtained from the RC oscillator, a total current dissipation, a duty-ratio of the oscillation signal, and a shifting characteristics of a reference voltage obtained from the temperature compensating reference voltage section while the supply voltage of the RC oscillating circuit is varied, respectively.
Figure 7B:
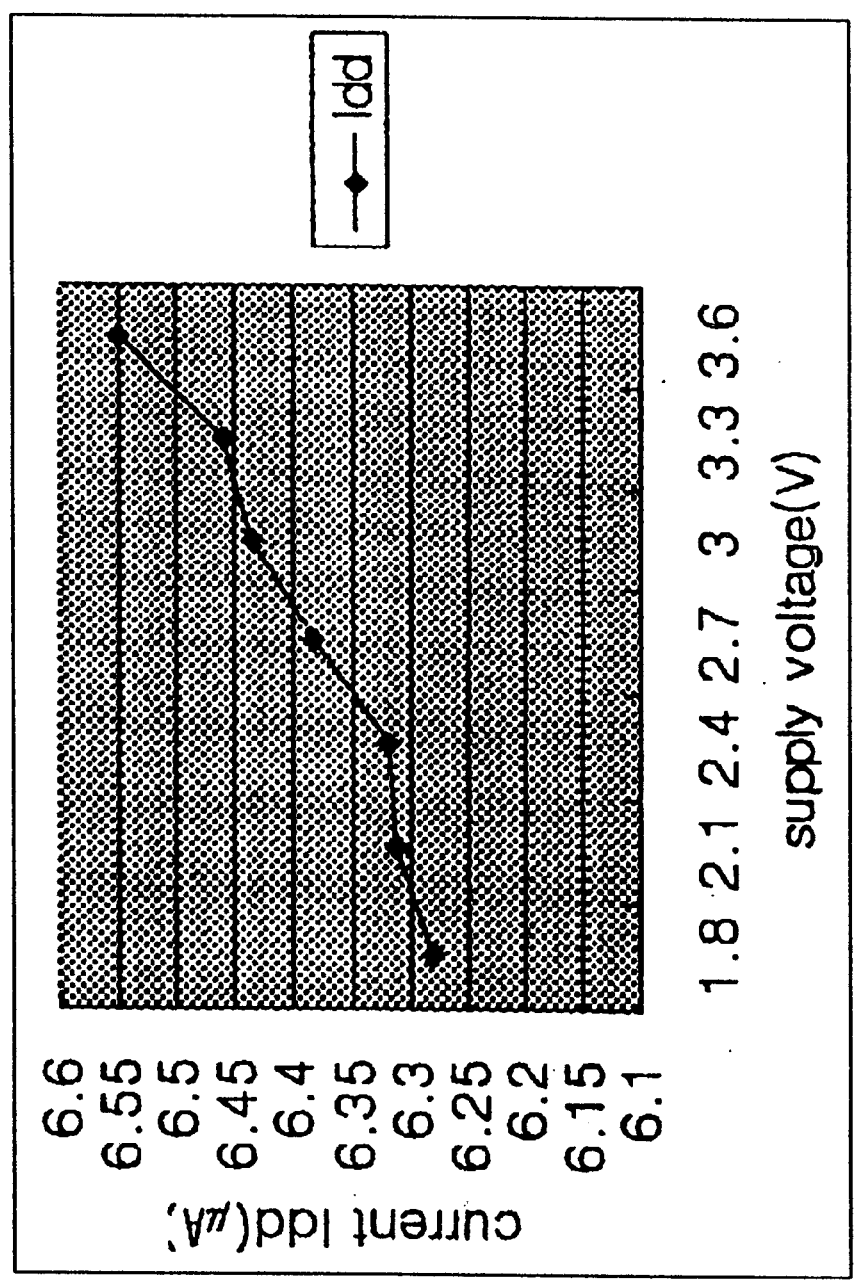
Figure 7C:
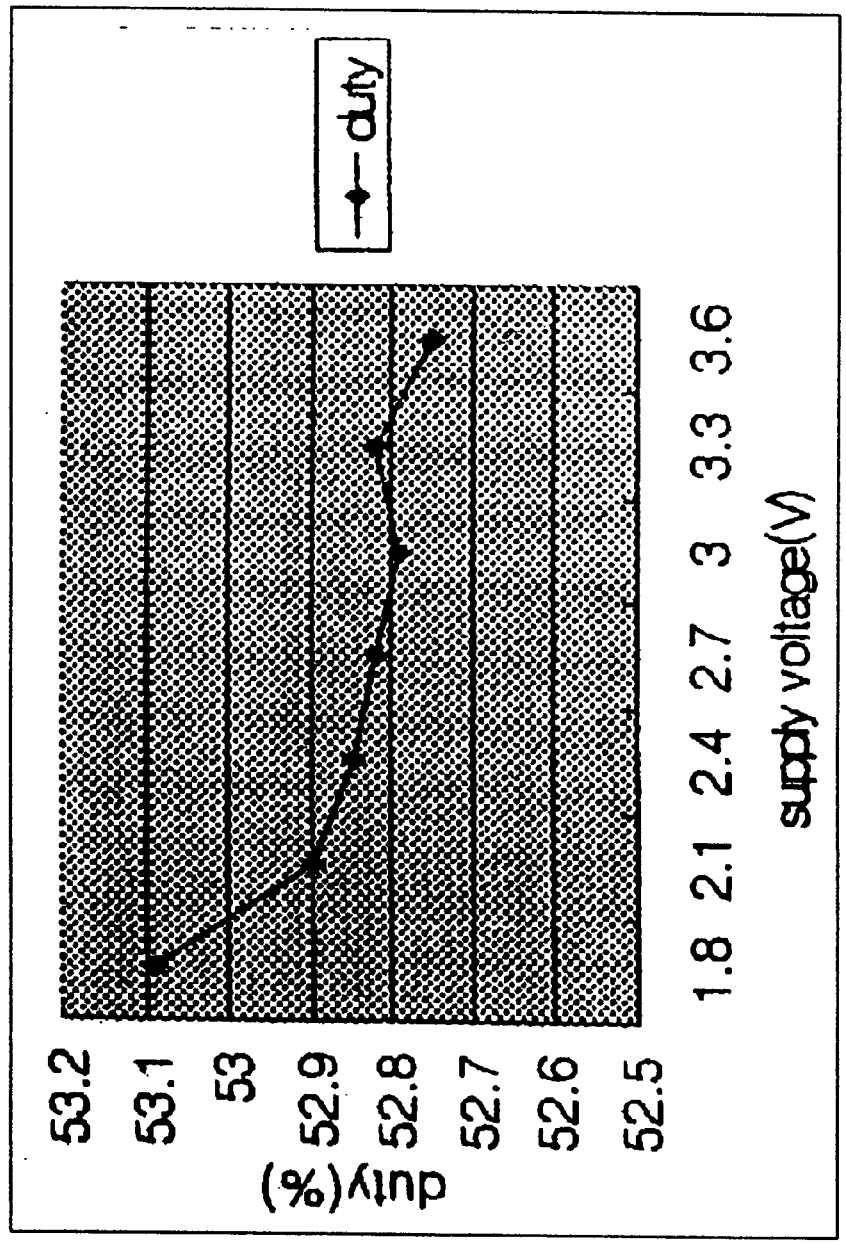
Figure 7D:
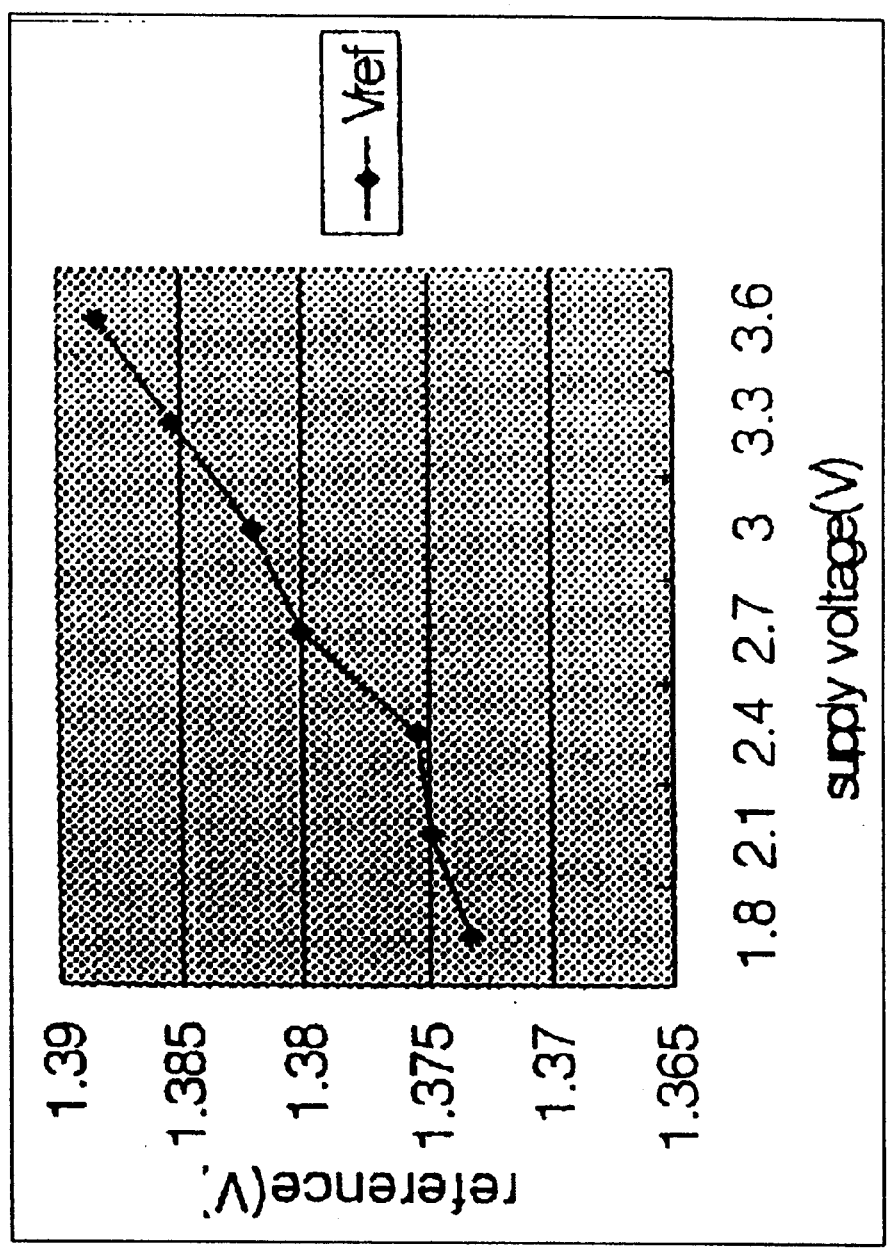
Figure 7E:
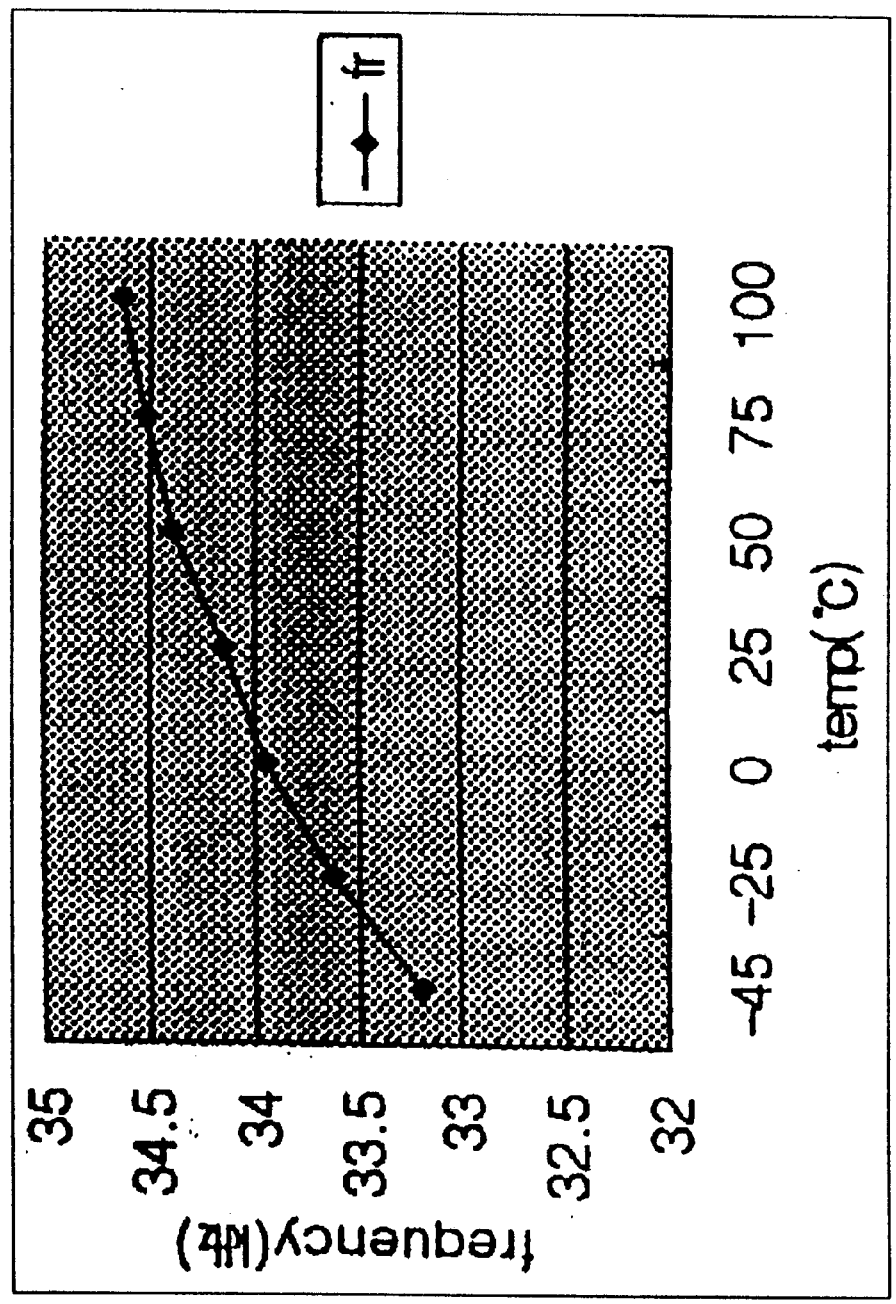
FIGS. 7E to 7G show an oscillation frequency of the RC oscillator, a total current dissipation and shifting characteristics of the reference voltage according to the temperature variation, respectively.
Figure 7F:
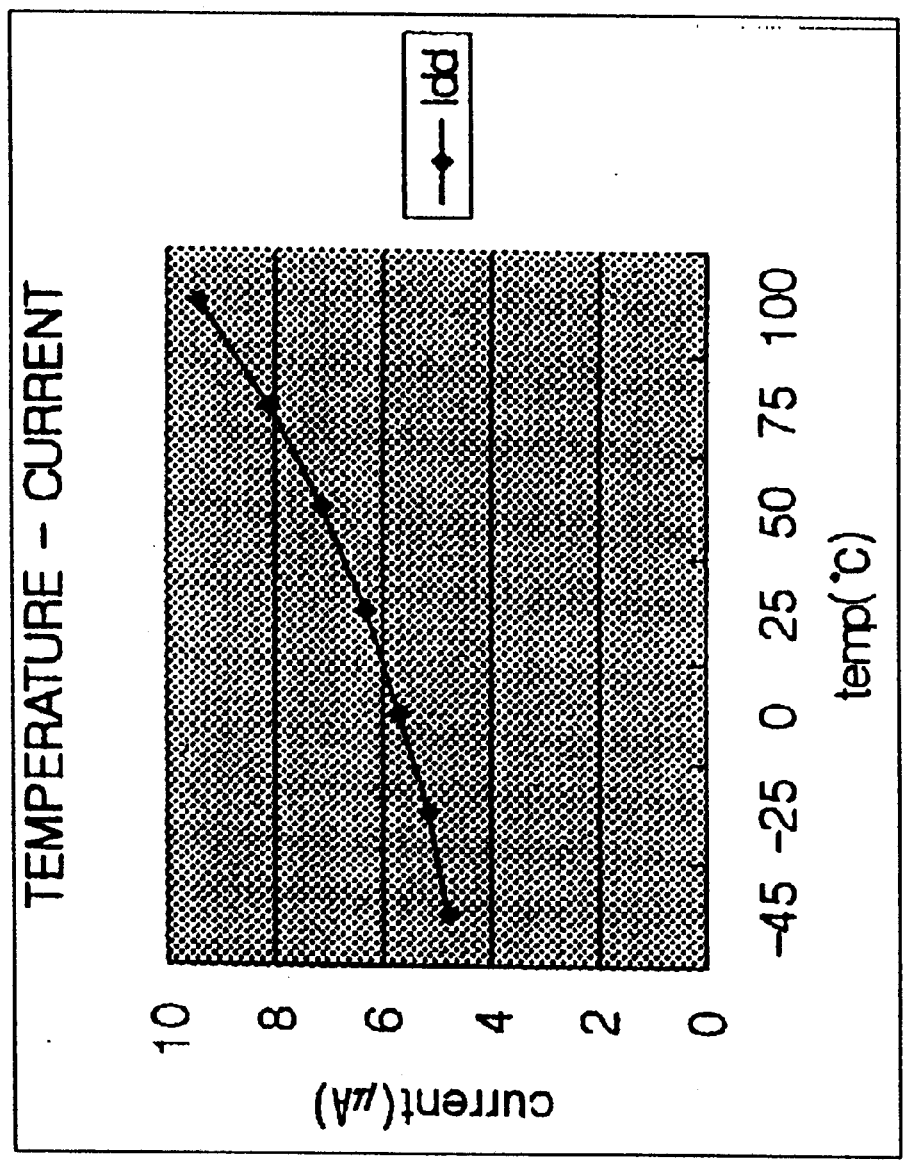
Figure 7G:
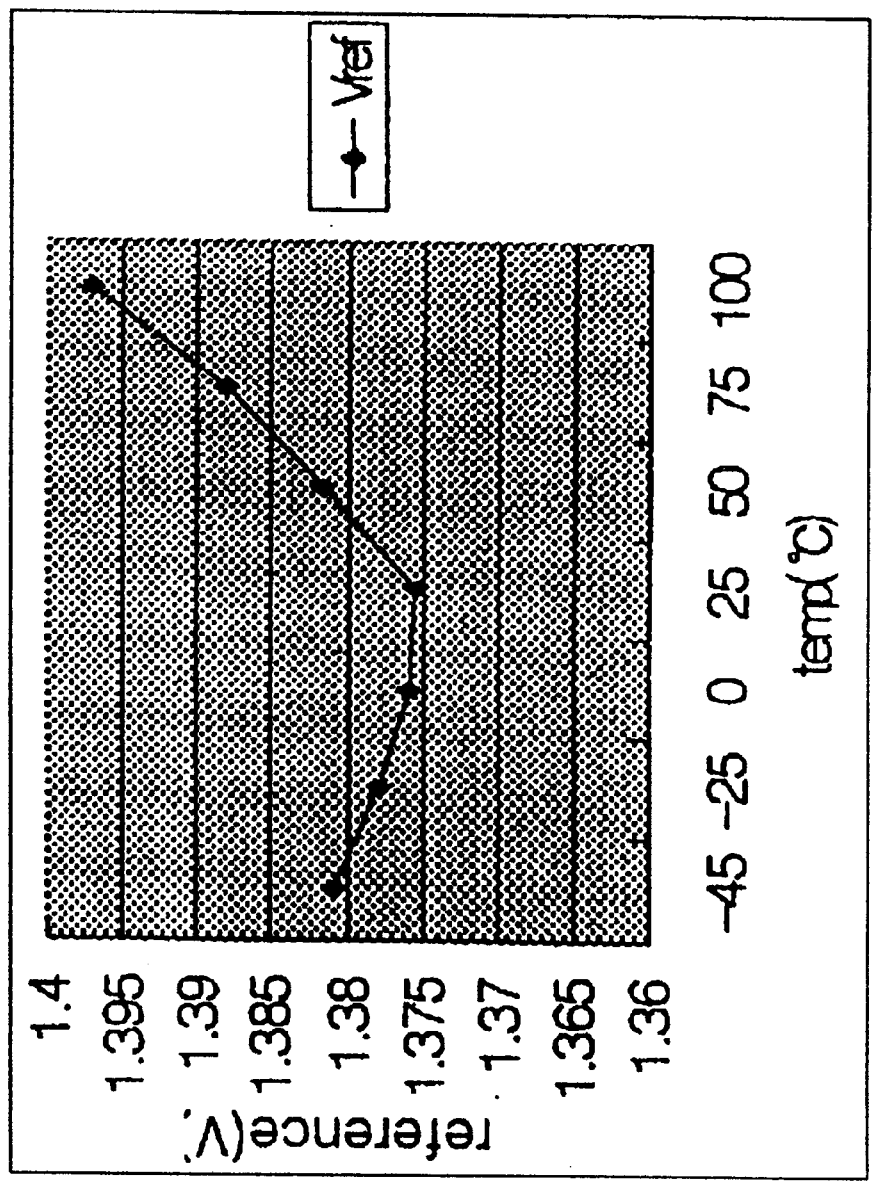

FIGS. 7E to 7G illustrate the oscillation frequency, the total consumption current Idd and the change characteristics of the reference voltage Vref of the experimental micropower RC oscillator 400 against the temperature variation. The degree change of the oscillation frequency against the temperature variation of about −45C.~100C. is about 1.43 Khz and the change range of the total consumption current Idd and the reference voltage Vref are about 4 uA and 0.02V, respectively. The consumption current Idd shows a degree change of about 5.16~8.13 uA against the temperature variation in an operating region having a temperature range of −25C.~75C. and the degree change of the reference voltage is about 21.3 mA. Even though the present invention focuses to have a stable temperature characteristics, if a stable temperature characteristics of the capacitor C or the bi-directional transmission gates of the RC oscillation circuit 200 is considered, the degree of variance can be further decreased.

Figure 7H:
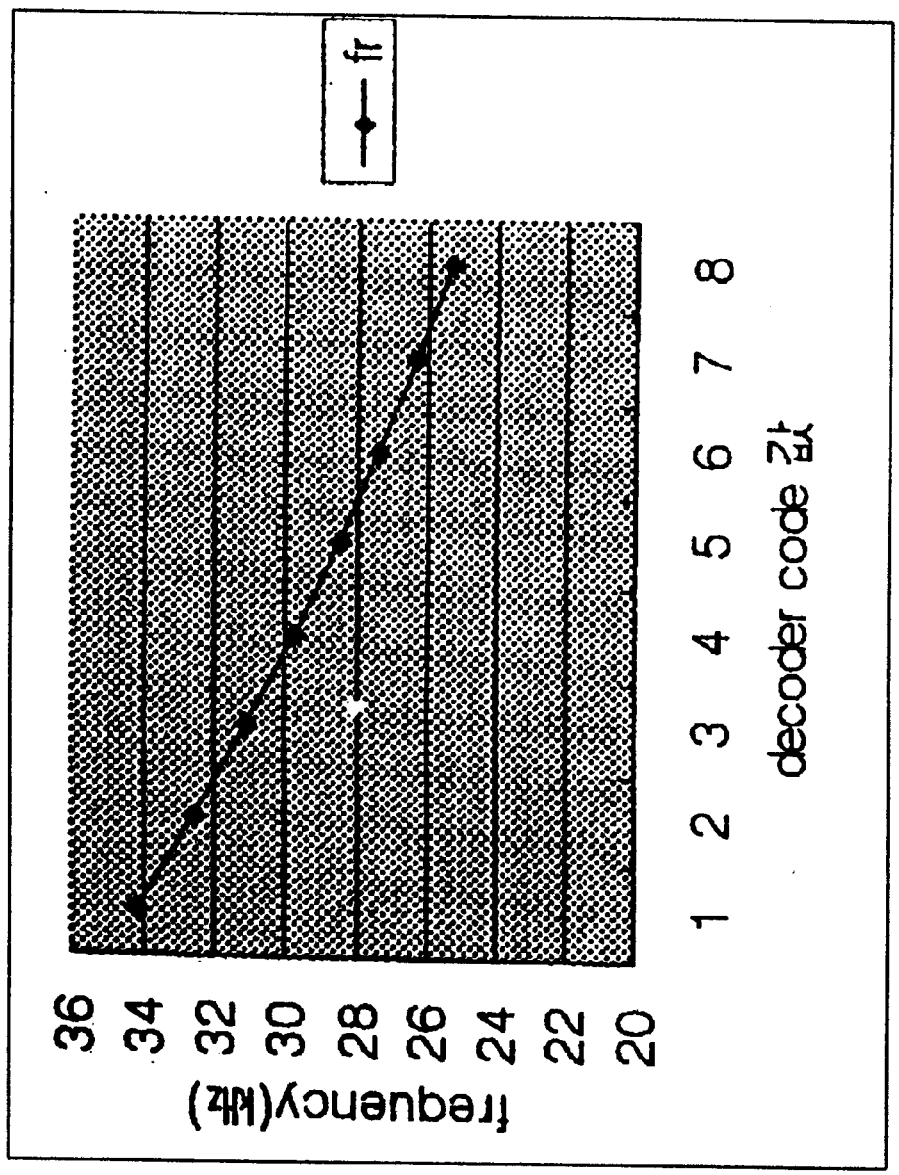
FIG. 7H shows the change characteristics of the oscillation frequency of the oscillation signal against the input data of the decoder 280.

FIG. 7H shows the change characteristics of the oscillation frequency of the oscillation signal against the input data of the decoder 280. In a case where the input data of the decoder 280 are 3 bits (shown a case of 2 bits in FIG. 3) and the input data are varied from 1 to 8, the size of the oscillation frequency is varied while changing the resistance value of the variable resistor Rv. At this time, the variance range of the oscillation frequency is about 9 KHz.

Meanwhile, when the voltage variation characteristics and the fabricating process condition against the temperature are satisfied, it is irrelevant whether the transistor of the output terminal 114 of the temperature compensating reference voltage section 110 shown in FIG. 2 is, or is not, an MOS transistor. That is, in a case where the transistor of the output terminal has an inverse proportional voltage down characteristics against the temperature variation, namely CTAT characteristics, and fabricated along with the MOS transistor constituting of the PTAT current source 112, the bipolar transistor can be used. For example, FIGS. 8 and 9 illustrate the circuit configuration of the temperature compensating reference voltage section 110 employing the bipolar transistor instead of the MOS transistor as an output terminal transistor.

Figure 8:
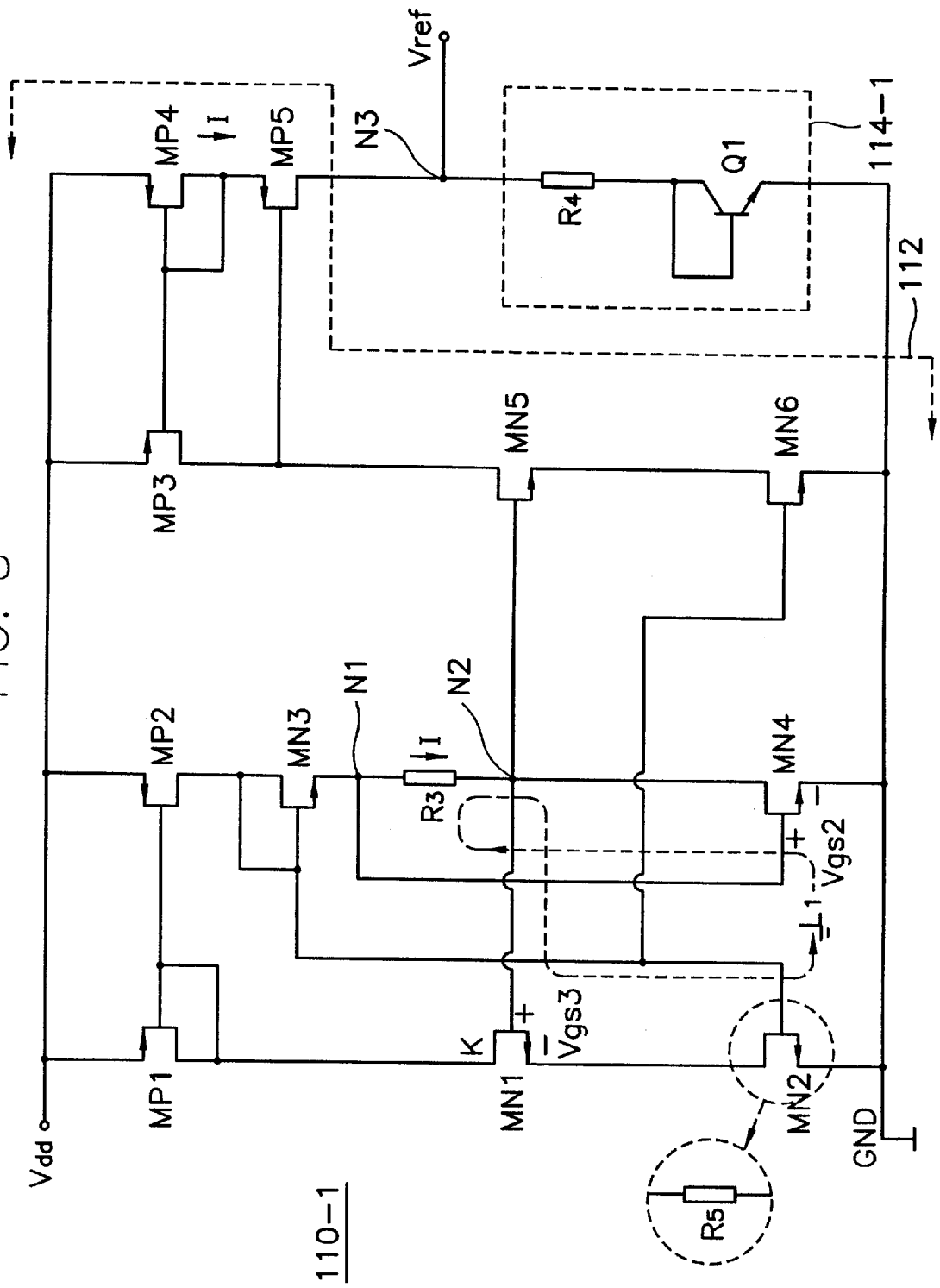
FIG. 8 shows a circuit configuration according to a second embodiment of the temperature compensating reference voltage section which employs a bipolar transistor according to a CMOS process as an output stage transistor instead of an MOS transistor.
Figure 9:
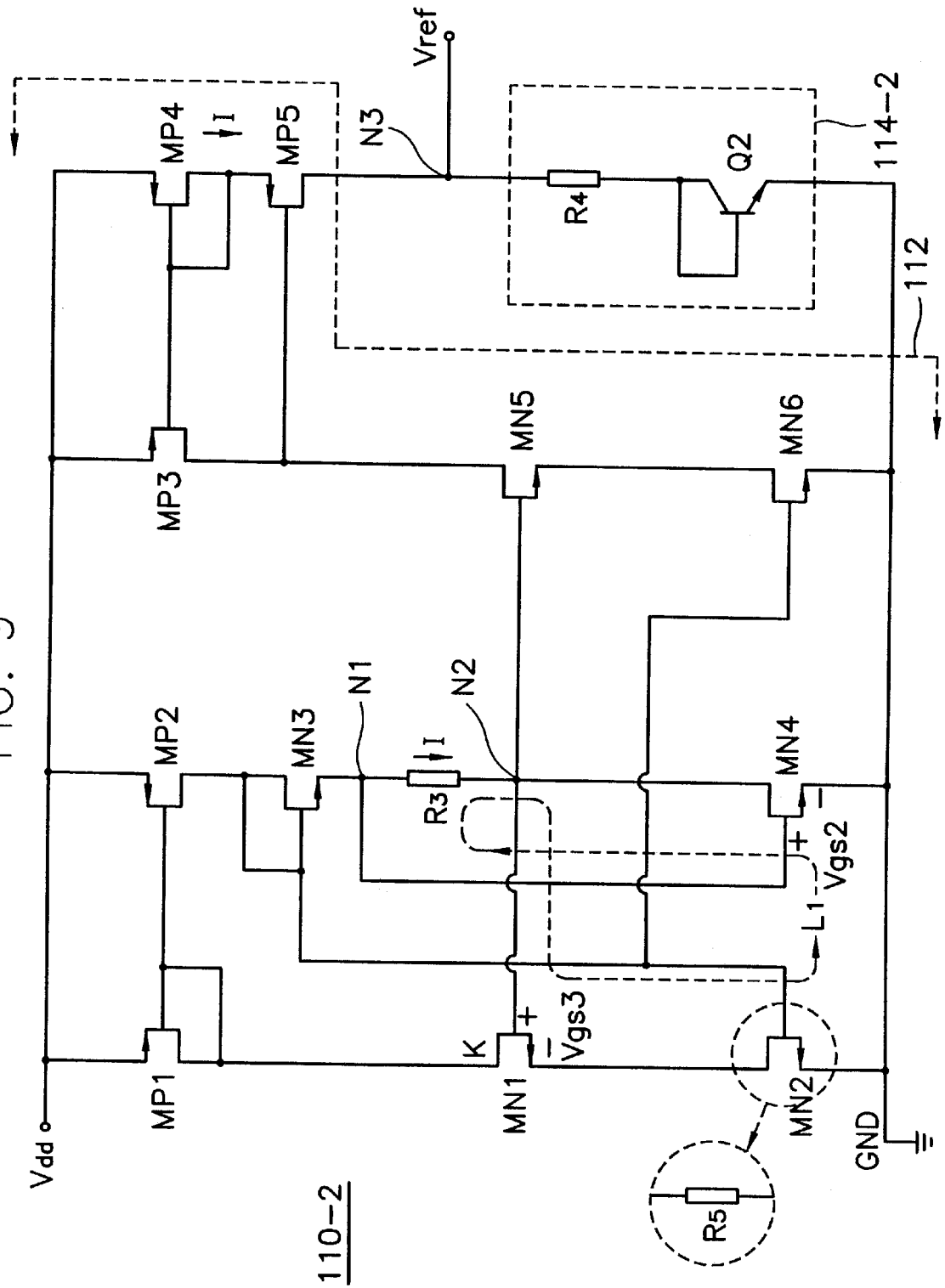
FIG. 9 shows a circuit configuration according to a third embodiment of the temperature compensating reference voltage section which employs a biopolar transistor according to a BiCMOS process as the output stage transistor instead of an MOS transistor.

The transistor of the output terminal 114-1 shown in FIG. 8 is a substrate bipolar transistor Q1 fabricated by CMOS process and the transistor of the output terminal 114-2 shown in FIG. 9 is a bipolar transistor Q2 fabricated by BiCMOS process. The substrate bipolar transistor is a bipolar transistor capable of fabrication in a CMOS process where the emitter is structurally connected to the P-type substrate. FIGS. 8 and 9 respectively represent the case of the SPNP (substrate PNP) type bipolar transistor Q1 and NPN type bipolar transistor Q2 and the collector and base of each of the bipolar transistors Q1 and Q2 are shorted and operated as a diode.

In FIG. 8 or 9, the reference voltage Vref in the output node N3 is presented as follows. The bipolar transistor basically has CTAT characteristics as the change characteristics of base-emitter voltage VBE against the temperature variation is −2.0 mV/C. Accordingly, IR4 indicates the PTAT characteristics and the $V_{BE1}$ or $V_{BE2}$ indicates CTAT characteristics.

$$Vref = IR4 + V_{BE1} \text{ or} \qquad \text{[Equation 17]}$$
$$= IR4 + V_{BE2}$$

Here, $V_{BE1}$ or $V_{BE2}$ are a base-emitter voltage of the bipolar transistors Q1 or Q2, respectively.

In the RC oscillating circuit, the primary issues are the reduction of power supplied, the stability of the individual circuit configuration with varying temperature and the minimization of the process tolerance of the resistor and the capacitor. As can be seen from the circuit design and the measurement of the characteristics thereof, since the RC oscillating circuit of the present invention has stable frequency characteristics, the RC oscillating circuit can generate an accurate oscillation signal without being adversely affected by temperature variation. Furthermore, the oscillating circuit can be constituted as a low power dissipation type by lowering the level of the driving voltage supplied to the RC oscillating circuit and by using a low voltage in the output level shifting circuit; therefore, it is well-suited for application as a clock signal source in a portable electronic device, for example.

While the present invention has been particularly shown and described with reference to preferred embodiments thereof, it will be understood by those skilled in the art that various changes in form and detail may be made herein without departing from the spirit and scope of the invention as defined by the appended claims.

For example, by modifying the MOS transistors constituting of the circuit shown in FIG. 2 or FIG. 4, that is, by changing the N type to P type, or vice versa, by changing the P type to N type, a new circuit can be constituted. Also, the bipolar transistors Q1 or Q2 shown in FIG. 8 can be changed to PNP-type bipolar transistors.

What is claimed is:

1. A micropower RC oscillator comprising:

a driving voltage circuit for receiving a reference signal having a stable voltage level in view of temperature variation by means of a current source and a load having opposing temperature variation characteristics, and for increasing current fan-out capacity of the reference signal to generate a driving voltage; and an RC oscillation circuit having an RC circuit including a plurality of inverting circuits connected in series and respectively driven by the driving voltage, a variable resistor connected between an output terminal of a head-inverter at an output stage and an input terminal of a tail-inverter to form a closed loop, and a capacitor connected between the input terminal of the tail-inverter and an input terminal of the head-inverter, wherein a resistance value of the variable resistor is variably set in response to externally supplied resistance data composed by means of combining a resistance factor that varies opposite the temperature variation based on a predetermined ratio and an oscillation signal that oscillates in accordance with a frequency determined by a time constant of the RC circuit generated at the output terminal.

2. The micropower RC oscillator as claimed in claim 1, further comprising an output level shifter for shifting the voltage level of the oscillation signal output from the RC oscillation circuit and outputting the oscillation signal as a predetermined voltage level.

3. The micropower RC oscillator as claimed in claim 1, wherein the variable resistor is composed to have temperature compensating characteristics by combining a $P^+$ diffusion resistor and a poly-silicon resistor having opposing characteristics in view of the temperature variation at the predetermined ratio.

4. The micropower RC oscillator as claimed in claim 1, wherein the variable resistor comprises a plurality of unit resistors and a resistance regulator for selecting an effective resistance value that contributes to decide an oscillation frequency among the plurality of unit resistors based on the resistance data, and the plurality of unit resistors respectively have a temperature compensating characteristics by combining a $P^+$ diffusion resistor and a poly-silicon resistor having opposing characteristics with the temperature variation in series.

5. The micropower RC oscillator as claimed in claim 4, wherein the plurality of unit resistors are interconnected in series, and the resistance regulator further comprises a decoder for decoding the resistance data and outputting the resistance data to a plurality of output ports, a plurality of inverters connected to the respective output ports of the decoder to invert an output value from the respective output ports and a resistance selector having a plurality of bi-directional transmission gates respectively corresponding to the unit resistors, wherein one end of the bi-directional transmission gates are interconnected and other end thereof are respectively connected to one end of the plurality of unit resistors, each of a first control terminal of the bi-directional transmission gates are connected to the output ports of the decoder, and each of a second control terminal thereof are respectively connected to an output terminal of the plurality of the inverters respectively connected to the plurality of the output ports of the decoder.

6. The micropower RC oscillator as claimed in claim 2, wherein the output level shifter includes a level shift circuit responsive to the oscillation signal supplied from the RC oscillation circuit, for outputting a boosted oscillation signal having an amplitude larger than an amplitude of the oscillation signal; and an output buffer circuit for outputting the oscillation signal having the amplitude adjusted to the level of a supply voltage in response to the boosted oscillation signal.

7. The micropower RC oscillator as claimed in claim 1, wherein the driving voltage circuit includes a temperature compensating reference voltage section having an output stage comprising a first resistor and a first transistor connected to the first resistor in series and having reciprocal voltage characteristics against the temperature variation, a PTAT current source connected to the output stage to supply a current having direct proportional characteristics against the temperature variation to a branch of the output stage, and the reference signal has a voltage applied to both ends of the output stage; and a buffer amplifier for increasing the fan-out capacity of the reference signal generated from the temperature compensating reference voltage section.

8. The micropower RC oscillator as claimed in claim 7 wherein the first transistor is an MOS transistor in which a source-gate voltage has reciprocal characteristics against the temperature variation in a weak inversion region.

9. The micropower RC oscillator as claimed in claim 7, wherein the first transistor is an NPN type bi-polar transistor fabricated by a BiCMOS process.

10. The micropower RC oscillator as claimed in claim 7, wherein the first transistor is a substrate NPN type bi-polar transistor fabricated by a CMOS process.

11. The micropower RC oscillator as claimed in claim 7, wherein the micropower RC oscillator further comprises a voltage amplifier, disposed between the temperature compensating reference voltage section and the buffer amplifier, for amplifying the voltage level of the reference signal generated from the temperature compensating reference voltage section to provide an amplified reference signal to the buffer amplifier.

12. The micropower RC oscillator as claimed in claim 7, wherein the PTAT current source comprises a first circuit having a first branch in which a second MOS transistor and a second resistor are connected in series, a second branch in which a third resistor and a third MOS transistor are connected in series and a mirror current source for supplying a branch current to the second resistor and third resistor, and both ends of the third resistor are respectively connected to the gates of the second MOS transistor and third MOS transistor so that the branch current is represented by $I=(Vgs3-Vgs1)/(R2+R3)=nV_T \ln K$; and a second circuit for mirroring the branch current of the first circuit and providing the branch current to the load, wherein n is an ideality factor, Vgs2 and Vgs3 are gate-source voltage of the second and third MOS transistors respectively represented in a weak inversion region, $V_T$ is a threshold voltage of the second and third MOS transistors, R2 and R3 represent the resistances of the second and third resistors, and K represents a size ratio of a channel width of a source-drain between the second transistor and the third MOS transistor.

13. A micropower RC oscillator comprising;

a temperature compensating reference voltage means comprising an output terminal resistor and an output terminal transistor which are connected between an output terminal and a ground terminal in series and generating a reference signal having a stable voltage level in view of a temperature variation at the output terminal, wherein the output terminal transistor includes an output stage having a reciprocal voltage down characteristics with the temperature variation, and a PTAT current source, connected to the output stage, having direct proportional characteristics against the temperature variation;

a voltage amplifying means for amplifying the voltage level of the reference signal generated from the temperature compensating reference voltage means and outputting the reference signal;

a buffer amplifying means for buffering the reference signal amplified by the voltage amplifying means to output a driving voltage having an increased fan-out capacity;

an RC oscillation circuit having an RC circuit including a plurality of inverting circuits connected in series and respectively driven by the driving voltage, a variable resistor circuit which forms a closed loop disposed between an output terminal of a head-inverter at an output stage and an input terminal of a tail-inverter, and which changes a resistance value thereof according to an external resistance setting data, and a capacitor disposed between an input terminal of the head-inverter and the input terminal of the tail-inverter and generating an oscillation signal having an oscillation frequency determined by a time constant of the RC circuit at the output stage; and a level shift circuit for boosting the oscillation signal to a predetermined voltage level and outputting the oscillation signal.

14. The micropower RC oscillator as claimed in claim 13, wherein the output terminal transistor is an MOS transistor in which a source-gate voltage has reciprocal characteristics against the temperature variation in a weak inversion region.

15. The micropower RC oscillator as claimed in claim 13, wherein the output terminal transistor is an NPN type bi-polar transistor fabricated by a BiMOS process.

16. The micropower RC oscillator as claimed in claim 13, wherein the output terminal transistor is an SNPN type bi-polar transistor fabricated by a CMOS process.

17. The micropower RC oscillator as claimed in claim 13, wherein the variable resistor circuit comprises a plurality of unit resistors; and a resistance regulator for selecting an effective resistance value that contributes effectively to decide the oscillation frequency among the plurality of unit resistors based on the resistance setting data, wherein the plurality of unit resistors respectively have stable temperature characteristics by combining a P+ diffusion resistor and a polysilicon resistor having opposing characteristics against the temperature variation in a predetermined ratio.

18. The micropower RC oscillator as claimed in claim 17, wherein the plurality of unit resistors are connected in series with each other, and the resistance regulator comprises a decoder for decoding the resistance setting data and outputting the resistance setting data to a plurality of output ports, a plurality of inverters connected to each of the respective output ports of the decoder for inverting an output value of each of the output ports, and a resistance selector including a plurality of bi-directional transmission gates corresponding to each of the unit resistors, wherein each of one ends of the bi-directional transmission gates are connected to a common terminal and each of other end thereof are respectively connected to each of one end of the plurality of unit resistors, and each of the first control terminal of the bi-directional transmission gates are respectively connected to the output port of the decoder and each of the second control terminal are respectively connected to the output port of the inverter connected to the output port of the decoder, respectively.

19. The micropower RC oscillator as claimed in claim 13, wherein the PTAT current source comprises a first circuit having a first branch in which a first MOS transistor and a first resistor are connected in series, a second branch in which a second resistor and a second MOS transistor are connected in series and a mirror current source for supplying a branch current I to the first and second resistors, and both ends of the second resistor are respectively connected to the gates of the first MOS transistor and the second MOS transistor so that the branch current is represented by I=(Vgs2−Vgs1)/(R2+R1)=$nV_T$lnK; and a second circuit for mirroring the branch current of the first circuit and supplying the branch current to the load, wherein n is an ideality factor, Vgs1 and Vgs2 respectively represent gate-source voltages of the first and second MOS transistors in a weak inversion region, $V_T$ is a threshold voltage of the first and second MOS transistors, R1 and R2 represent the resistances of the first and second resistors, and K represents a size ratio of the first MOS transistor against the second MOS transistor.

20. The micropower RC oscillator as claimed in claim 13, further comprising an output buffer circuit for buffering the voltage level of the output signal to be adjusted to the voltage level of the supply voltage in response to the boosted oscillation signal.

21. The micropower RC oscillator as claimed in claim 20, wherein the operation of the level shift circuit and the output buffer circuit is halted in response to an external disable signal.

22. An RC oscillating circuit comprising;

a plurality of inverters interconnected in series and driven by means of an independently supplied driving voltage; and an RC circuit including a variable resistor circuit which forms a closed loop between an output terminal of a head-inverter connected to an output stage and an input terminal of a tail-inverter and changes a resistance value according to an external resistance setting data and a capacitor disposed between an input terminal of the head-inverter and the input terminal of the tail-inverter, wherein the variable resistor circuit includes a plurality of unit resistors and a resistance regulator for selecting an effective resistance value that contributes to determine an oscillation frequency among the plurality of unit resistors based on the resistance setting data, and wherein each of the plurality of unit resistors includes a p+ diffusion resistor and a polysilicon resistor having opposing characteristics with respect to a temperature variation at a predetermined ratio and generates an oscillation signal having the oscillation frequency determined by a time constant of the RC circuit to the output stage.

23. The RC oscillating circuit as claimed in claim 22, wherein the resistance regulator comprises a decoder for decoding the resistance setting data and outputting the resistance setting data to a plurality of output ports, a plurality of inverters respectively connected to the output ports of the decoder to invert an output value from the respective output ports and a resistance selector having a plurality of bi-directional transmission gates respectively corresponding to the unit resistors, wherein first ends of the bi-directional transmission gates are interconnected and second ends thereof are respectively connected to the plurality of unit resistors, each of a first control terminal of the bi-directional transmission gates are connected to the output ports of the decoder, and each of a second control terminal thereof are respectively connected to an output terminal of the plurality of the inverters respectively connected to the plurality of the output ports of the decoder.

24. The RC oscillating circuit as claimed in claim 22, wherein the variable resistor circuit and the decoder are installed in one-chip.

* * * * *